United States Patent
Paul et al.

(10) Patent No.: US 12,140,707 B2
(45) Date of Patent: Nov. 12, 2024

(54) SINGLE PHOTON AVALANCHE DETECTOR, METHOD FOR USE THEREFORE AND METHOD FOR ITS MANUFACTURE

(71) Applicants: The University Court of the University of Glasgow, Glasgow (GB); Heriot-Watt University, Edinburgh (GB)

(72) Inventors: Douglas John Paul, Glasgow (GB); Derek Dumas, Glasgow (GB); Jaroslaw Kirdoda, Glasgow (GB); Ross W. Millar, Glasgow (GB); Muhammad M. Mirza, Glasgow (GB); Gerald S. Buller, Edinburgh (GB); Peter Vines, Edinburgh (GB); Kateryna Kuzmenko, Edinburgh (GB)

(73) Assignees: The University Court of the University of Glasgow, Glasgow (GB); Heriot-Watt University, Edinburgh (GB)

( * ) Notice: Subject to any disclaimer, the term of this patent is extended or adjusted under 35 U.S.C. 154(b) by 814 days.

(21) Appl. No.: 17/274,914

(22) PCT Filed: Sep. 9, 2019

(86) PCT No.: PCT/GB2019/052508
§ 371 (c)(1),
(2) Date: Mar. 10, 2021

(87) PCT Pub. No.: WO2020/053564
PCT Pub. Date: Mar. 19, 2020

(65) Prior Publication Data
US 2022/0050184 A1    Feb. 17, 2022

(30) Foreign Application Priority Data
Sep. 10, 2018  (GB) .................... 1814688

(51) Int. Cl.
*H01L 31/107*    (2006.01)
*G01J 1/44*    (2006.01)
(Continued)

(52) U.S. Cl.
CPC .............. *G01S 7/4863* (2013.01); *G01J 1/44* (2013.01); *H01L 31/1075* (2013.01); *H01L 31/18* (2013.01)

(58) Field of Classification Search
CPC ........ G01S 7/4863; G01S 7/4912; G01J 1/44; H01L 31/1075; H01L 31/18
See application file for complete search history.

(56) References Cited

U.S. PATENT DOCUMENTS

2012/0126286 A1* 5/2012 Na .................... H01L 31/02005
                                                                  250/371
2012/0326259 A1   12/2012 Huang et al.
(Continued)

FOREIGN PATENT DOCUMENTS

GB    2562481 A    11/2018
JP    S5891686 A    5/1983
(Continued)

OTHER PUBLICATIONS

Intermite et al. "Design and performance of a prototype mesa-geometry Ge-on-Si single-photon avalanche diode detector at 1310 nm and 1550 nm wavelengths" Conference on Group IV Photonics, IEEE, pp. 132-133 (2013).
(Continued)

*Primary Examiner* — Elias Ullah
(74) *Attorney, Agent, or Firm* — Myers Bigel, P.A.

(57) ABSTRACT

A single photon avalanche diode (SPAD) device is presented. The SPAD device comprising: a Si-based avalanche layer formed over an n-type semiconductor contact layer; a p-type charge sheet layer formed in or on the avalanche
(Continued)

layer, the p-type charge sheet layer having an in-plane width; a Ge-based absorber layer, formed over the charge sheet layer and/or the avalanche layer, and overlapping the charge sheet layer, the Ge-based absorber layer having an in-plane width; wherein, at least in one in-plane direction, the in-plane width of the Ge-based absorber layer is greater than the in-plane width of the p-type charge sheet layer.

20 Claims, 14 Drawing Sheets

(51) Int. Cl.
   G01S 7/4863       (2020.01)
   H01L 31/18        (2006.01)

(56) References Cited

U.S. PATENT DOCUMENTS

| | | | |
|---|---|---|---|
| 2013/0300838 A1 | 11/2013 | Borowski | |
| 2014/0186991 A1 | 7/2014 | Huang et al. | |
| 2014/0319638 A1* | 10/2014 | Chia | H01L 31/107 257/438 |
| 2015/0028443 A1 | 1/2015 | Shi et al. | |
| 2015/0093914 A1* | 4/2015 | Yang | H01L 21/02178 438/778 |
| 2016/0172525 A1 | 6/2016 | Huang et al. | |
| 2018/0033895 A1* | 2/2018 | Mazzillo | H01L 27/14625 |
| 2022/0140157 A1* | 5/2022 | Yu | H01L 31/107 385/14 |

FOREIGN PATENT DOCUMENTS

| | | |
|---|---|---|
| JP | 2013207231 A | 10/2013 |
| JP | 2016213362 A | 12/2016 |

OTHER PUBLICATIONS

International Search Report and the Written Opinion of the International Searching Authority corresponding to International Patent Application No. PCT/GB2019/052508 (16 pages) (mailed Oct. 30, 2019).
Savage et al. "Sensitive and stable SiC APD for UV detection" Proc. SPIE 7726, Optical Sensing and Detection (8 pages) (2010).
Search Report under Section 17(5) corresponding to GB Application No. 1814688.6 (3 pages) (dated Feb. 28, 2019).
Amri et al. "Temporal jitter in free-running InGaAs/InP single-photon avalanche detectors" Optics Letters, 41(24):5728-5731 (2016).
Arnulf et al. "Transmission by Haze and Fog in the Spectral Region 0.35 to 10 Microns" Journal of the Optical Society of America, 47(6):491-498 (1957).
Binetti et al. "Optical properties of oxygen precipitates and dislocations in silicon" Journal of Applied Physics, 92(5):2437-2445 (2002).
Bird et al. "Terrestrial Solar Spectral Data Sets" Solar Energy, 30(6):563-573 (1983).
Buller et al. "Ranging and Three-Dimensional Imaging Using Time-Correlated Single-Photon Counting and Point-by-Point Acquisition" IEEE Journal of Selected Topics in Quantum Electronics, 13(4):1006-1015 (2007).
Buller et al. "Semiconductor Avalanche Diode Detectors for Quantum Cryptography" IEEE LEOS Newsletter, pp. 20-24 (2006).
Buller et al. "Single-photon generation and detection" Measurement Science and Technology, 21:1-28 (2010).
Buller et al. "Time-resolved photoluminescence measurements of InGaAs/InP multiple-quantum-well structures at 1.3-μm wavelengths by use of germanium single-photon avalanche photodiodes" Applied Optics, 35(6):916-921 (1996).
Charbon et al. "SPAD Sensors Come of Age" Optics and Photonics News, 21(2):34-41 (2010).

Christnacher et al. "Influence of gating and of the gate shape on the penetration capacity of range-gated active imaging in scattering environments" Optics Express, 23(26):32897-32908 (2015).
Cova et al. "Evolution and Prospect of Single Single-Photon Avalanche Diodes and Quenching Circuits" presentation from the National Institute of Standards & Technology Workshop on Single Photon Detectors, 36 pages (2003).
Dash et al. "Intrinsic Optical Absorption in Single-Crystal Germanium and Silicon at 77° K and 300° K" Physical Review, 99(4):1151-1155 (1955).
Derose et al. "Ultra compact 45 GHz CMOS compatible Germanium waveguide photodiode with low dark current" Optics Express, 19(25):24897-24904 (2011).
Dumont et al. "High-accuracy measurements of snow Bidirectional Reflectance Distribution Function at visible and NIR wavelengths—comparison with modelling results" Atmospheric Chemistry and Physics, 10:2507-2520 (2010).
Gordon et al. "A Short Wavelength GigaHertz Clocked Fiber-Optic Quantum Key Distribution System" IEEE Journal of Quantum Electronics, 40(7):900-908 (2004).
Gyongy et al. "Single-Photon Tracking for High-Speed Vision" Sensors, 18(323)1-14 (2018).
Hadfield, Robert H. "Single-photon detectors for optical quantum information applications" Nature Photonics, 3:696-705 (2009).
International Standard 60825-1, Edition 1.2 "Safety of laser products—Part 1: Equipment classification, requirements and user's guide" (122 pages) (2001).
Itzler et al. "Single photon avalanche diodes (SPADs) for 1.5 μm photon counting applications" Journal of Modern Optics, 54(2-3):283-304 (2007).
Jiang et al. "InGaAsP—InP Avalanche Photodiodes for Single Photon Detection" IEEE Journal of Selected Topics in Quantum Electronics, 13(4):895-905 (2007).
Jiang et al. "InP-Based Single-Photon Detectors and Geiger-Mode APD Arrays for Quantum Communications Applications" IEEE Journal of Selected Topics in Quantum Electronics, 21(3):3800112 (2015).
Kang et al. "Monolithic germanium/silicon avalanche photodiodes with 340 GHz gain-bandwidth product" Nature Photonics, 3:59-63 (2009).
Korzh et al. "Afterpulsing studies of low-noise InGaAs/InP single-photon negative-feedback avalanche diodes" Journal of Modern Optics, 62(14):1151-1157 (2015).
Korzh et al. "Provably secure and practical quantum key distribution over 307 km of optical fibre" Nature Photonics, 9:163-168 (2015).
Lacaita et al. "Strong Dependence of Time Resolution on Detector Diameter in Single Photon Avalanche Diodes" Electronic Letters, 26(24):2053-2054 (1990).
Legoues et al. "Mechanism and conditions for anomalous strain relaxation in graded thin films and superlattices" Journal of Applied Physics, 71(9):4230-4243 (1992).
Loudon et al. "Enhancement of the infrared detection efficiency of silicon photon-counting avalanche photodiodes by use of silicon germanium absorbing layers" Optics Letters, 27(4):219-221 (2002).
Lu et al. "Geiger-Mode Operation of Ge-on-Si Avalanche Photodiodes" IEEE Journal of Quantum Electronics, 47(5):731-735 (2011).
Martinez et al. "High performance waveguide-coupled Ge-on-Si linear mode avalanche photodiodes" Optics Express, 24(17):1-10 (2016).
Martinez et al. "Single photon detection in a waveguide-coupled Ge-on-Si lateral avalanche photodiode" Optics Express, 25(14):1-10 (2017).
McCarthy et al. "Kilometer-range depth imaging at 1550 nm wavelength using an InGaAs/InP singlephoton avalanche diode detector" Optics Express, 21(19):22098-22113 (2013).
Niclass et al. "Development of Automotive LIDAR" Electronics and Communications in Japan, 98(5):28-33 (2015).
Noble et al. "Reduction in misfit dislocation density by the selective growth of Si1-xGex/Si in small areas" Applied Physics Letters, 56(1):51-53 (1990).

(56) References Cited

OTHER PUBLICATIONS

Paul, D. J. "8-band k.p modeling of the quantum confined Stark effect in Ge quantum wells on Si substrates" Physical Review B, 77:155323 (2008).

Paul, D. J. "8-band k•p modelling of mid-infrared intersubband absorption in Ge quantum wells" Journal of Applied Physics, 120:043103-1-043103-9 (2016).

Pawlikowska et al. "Single-photon three-dimensional imaging at up to 10 kilometers range" Optics Express, 25(10):1-13 (2017).

Pellegrini et al. "Industrialised SPAD in 40 nm Technology" IEEE International Electron Devices Meeting (IEDM), p. 16.5.1-16.5.4 (2017).

Pugh et al. "Airborne demonstration of a quantum key distribution receiver payload" Quantum Science and Technology, 2(2):1-16 (2017).

Sammak et al. "CMOS—Compatible PureGaB Ge-on-Si APD Pixel Arrays" IEEE Transactions of Electron Devices, 63(1):92-99 (2016).

Sauer et al. "Dislocation-Related Photoluminescence in Silicon" Applied Physics A, 36:1-13 (1985).

Sciacca et al. "Silicon Planar Technology for Single-Photon Optical Detectors" IEEE Transactions on Electron Devices, 50(4):918-925 (2003).

Shadbolt et al. "Testing foundations of quantum mechanics with photons" Nature Physics, 10:278-286 (2014).

Shevchenko, S. A. "Electrical conductivity of germanium with dislocation grids" Journal of Experimental and Theoretical Physics, 88(1):66-71 (1999).

Statz et al. "Surface States on Silicon and Germanium Surfaces" Physical Review, 106(3):455-464 (1957).

Sze, S. M. "Semiconductor Devices: Physics and Technology" 2nd Edition, 565 pages (1985).

Takai et al. "Single-Photon Avalanche Diode with Enhanced NIR-Sensitivity for Automotive LIDAR Systems" Sensors, 16(459)1-9 (2016).

Tobin et al. "Depth imaging through obscurants using time-correlated single-photon counting" Proceedings of SPIE, 10659:1-10 (2018).

Tosi et al. "Low-Noise, Low-Jitter, High Detection Efficiency InGaAs/InP Single-Photon Avalanche Diode" IEEE Journal of Selected Topics in Quantum Electronics, 20(6):1-6 (2014).

Tosi et al. "Single-photon avalanche diodes for the near-infrared range: detector and circuit issues" Journal of Modern Optics, 56(2-3):299-308 (2009).

Varshni, Y. P. "Temperature Dependence of the Energy Gap in Semiconductors" Physica, 34:149-154 (1967).

Wang et al. "Analysis of breakdown probabilities in avalanche photodiodes using a history-dependent analytical model" Applied Physics Letters, 82(12):1971-1973 (2003).

Warburton et al. "Ge-on-Si Single-Photon Avalanche Diode Detectors: Design, Modeling, Fabrication, and Characterization at Wavelengths 1310 and 1550 nm" IEEE Transactions on Electron Devices, 60(11):3807-3813 (2013).

Webster et al. "A TCAD and Spectroscopy Study of Dark Count Mechanisms in Single-Photon Avalanche Diodes" IEEE Transactions on Electron Devices, 60(12):4014-4019 (2013).

Zhang et al. "Advances in InGaAs/InP single-photon detector systems for quantum communication" Light: Science & Applications, 4:e286 (2015).

Zhang et al. "Al2O3/GeOx/Ge gate stacks with low interface trap density fabricated by electron cyclotron resonance plasma postoxidation" Applied Physics Letters, 98:112902-1-112902-3 (2011).

* cited by examiner

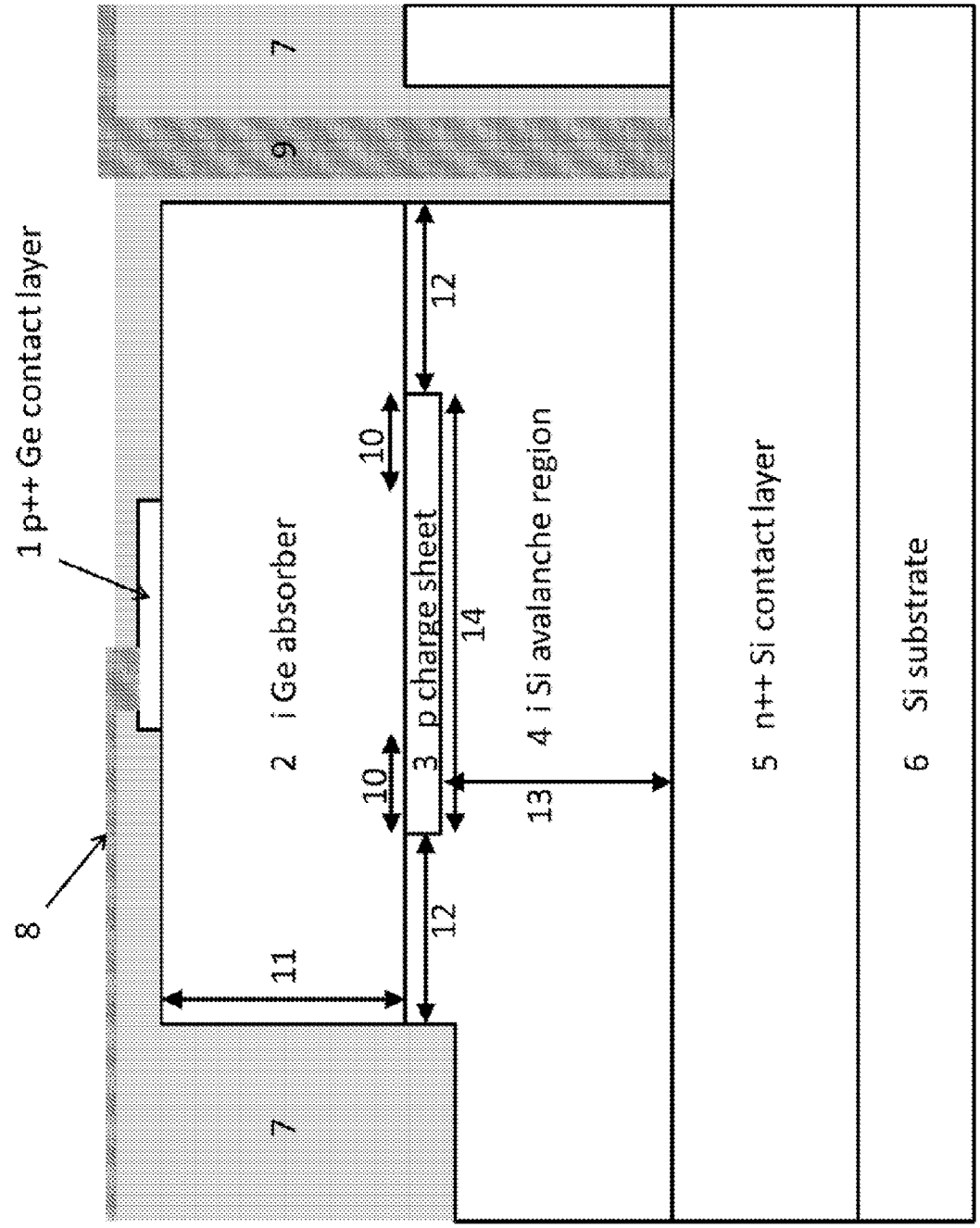

SINGLE PHOTON AVALANCHE DETECTOR, METHOD FOR USE THEREFORE AND METHOD FOR ITS MANUFACTURE

FIELD OF THE INVENTION

The present invention relates to single photon avalanche detectors (SPADs) and particularly, although not exclusively, to single photon avalanche detectors designed for operation at wavelength between 1300 and 1600 nm (SWIR) or 1700 nm. The present invention relates to arrays of such detectors, and also to methods for the use of such detectors or arrays and to methods for manufacturing such detectors or arrays.

BACKGROUND

Single photon detectors at 1310 nm and 1550 nm wavelengths are required for a wide range of applications including quantum optics, quantum enhanced imaging, quantum communications through fibre optics and LIDAR (Light Detection And Ranging) for automotive and autonomous vehicles. For the imaging and range finding applications, operation between 1500 and 1600 nm wavelengths is especially important as this is an atmospheric window where water vapour does not strongly absorb or scatter light compared to shorter wavelengths including the visible part of the spectrum. Smoke [54], smog [15], fog and haze [16] all have improved transparency in this window compared to the visible. Solar radiation which acts as the background signal in the visible wavelength is significantly reduced at 1550 nm from visible wavelengths [14]. Due to wavelengths above 1400 nm having increased laser safety thresholds [13] compared to visible and near-infrared, the optical power for sources in active systems such as LIDAR can also be increased at a wavelength of 1550 nm by at least a factor of 20 over visible wavelengths thereby improving signal to noise ratios in systems. There are therefore enormous improvements in LIDAR performance at 1550 nm compared to visible wavelengths especially in the presence of most obscurants.

Some reports state that the LIDAR market was worth $580M in 2016 (predominantly geographical and information systems plus military systems with CMOS image sensors and robotics about 40% of the market) which is expected to grow to $1.2 Bn in 2022 where automotive LIDAR will be 16% of the market. It would be of significant commercial interest to be able to provide a US $50 automotive LIDAR system for vehicles. Already a number of visible or close to visible (e.g. 905 nm or 940 nm) LIDAR systems that utilise all-silicon optical detectors are available for automotive and autonomous vehicles.

Silicon CMOS SPADs are available commercially and operate in the visible up to 940 nm where the single-photon detection efficiency (SPDE) is low 10%) due to the silicon indirect bandgap [12]. At present the only commercially available single-photon detectors at 1310 to 1550 nm wavelengths which operate using Peltier coolers at 233 K are InGaAs/InP SPADs devices, cost about £20 k for a single pixel module. Imaging arrays of these InGaAs/InP SPAD devices cost £100 k and are ITAR (a US regulatory regime) restricted. Superconducting single-photon detectors which require cryogenic operation below 8 K and typically cost £80 k each are also commercially available but the cryocoolers are bulky and require significant power limiting their ability to be used for portable applications. Both technologies are expensive whilst the market requirements especially for automotive and autonomous vehicles are generally for low-cost (about US $50) systems that the present technology will find extremely difficult to reach even at high volumes.

It would be desirable to be able to produce single photon detector devices which can be mass-manufactured to produce cheap products at volume with the required performance for the markets described above.

The present invention has been devised in light of the above considerations.

SUMMARY OF THE INVENTION

The present inventors have realised that significant performance may be provided using a planar Ge-on-Si SPAD architecture. This constitutes a general aspect of the invention. It is considered that this provides performance improvements over mesa-type planar Ge-on-Si SPAD architecture by providing lateral confinement of the electrical field in the Ge absorber layer, while utilising an inexpensive Ge-on-Si platform.

Accordingly, in a first preferred aspect, the present invention provides a single photon avalanche diode (SPAD) device comprising:
 a Si-based avalanche layer formed over an n-type semiconductor contact layer;
 a p-type charge sheet layer formed in or on the avalanche layer, the p-type charge sheet layer having an in-plane width;
 a Ge-based absorber layer, formed over the charge sheet layer and/or the avalanche layer, and overlapping the charge sheet layer, the Ge-based absorber layer having an in-plane width;
 wherein, at least in one in-plane direction, the in-plane width of the Ge-based absorber layer is greater than the in-plane width of the p-type charge sheet layer.

In a second preferred aspect, the present invention provides a SPAD array comprising at least a 1×2 arrangement of SPAD devices each according to the first aspect and formed on a common substrate.

In a third preferred aspect, the present invention provides a LIDAR system comprising a source of light of wavelength in the range 1.3-1.6 μm and a SPAD device according to the first aspect or a SPAD array according to the second aspect.

In a fourth preferred aspect, the present invention provides a use of a SPAD device according to the first aspect or a SPAD array according to the second aspect in the detection of at least one photon with wavelength in the range 0.9 μm-2.0 μm. The SPAD device according to the first aspect or the SPAD array according to the second aspect may be used in the detection of at least one photon with a wavelength in the range 1.3-1.6 μm.

In a fifth preferred aspect, the present invention provides a method of manufacture of a SPAD device according to the first aspect or of a SPAD array according to the second aspect wherein the p-type charge sheet layer is formed by selective area implantation into the Si-based avalanche layer.

Optional features of the present invention are now set out.
Preferably, in all in-plane directions, the in-plane width of the Ge-based absorber layer is greater than the in-plane width of the p-type charge sheet layer. This helps to ensure that the electric field distribution in the device is suitable to avoid "hot spots" in one or more regions. It also will help to reduce or avoid contribution to the dark count rate (DCR) from sidewall surface states.

The SPAD device may further comprise:

a p-type semiconductor contact layer formed over the absorber layer, the p-type semiconductor contact layer having an in-plane width, wherein at least part of the p-type semiconductor contact layer is formed substantially in register with at least part of the p-type charge sheet layer, with the Ge-based absorber layer interposed between them.

In this case, preferably, at least in one in-plane direction, the in-plane width of the Ge-based absorber layer is greater than the in-plane width of the p-type semiconductor contact layer. More preferably, in all in-plane directions, the in-plane width of the Ge-based absorber layer is greater than the in-plane width of the p-type semiconductor contact layer and greater than the in-plane width of the p-type charge sheet layer.

It is preferred that the entire p-type semiconductor contact layer is formed substantially in register with at least part of the p-type charge sheet layer. Alternatively, it is preferred that at least part of the p-type semiconductor contact layer is formed substantially in register with the entire p-type charge sheet layer The Ge-based absorber may have a sidewall in said in-plane direction. The charge sheet layer may have a lateral edge in said in-plane direction. When the Ge-based absorber has a thickness of at least 1 μm, the distance in the in-plane direction between the lateral edge of the charge sheet layer and the sidewall of the Ge-based absorber is preferably at least 1 μm greater than the thickness of the Ge-based absorber. It is considered that this provides suitable overlap of the Ge-based absorber over the p-type charge sheet layer in order to provide the technical advantages discussed above and below.

Alternatively, when the Ge-based absorber has a thickness of less than 1 μm, the distance in the in-plane direction between the lateral edge of the charge sheet layer and the sidewall of the Ge-based absorber may be at least 1.0 μm.

In some embodiments, the distance in the in-plane direction between the lateral edge of the charge sheet layer and the sidewall of the Ge-based absorber is at least 5 μm.

In some embodiments, when the width of the charge sheet is at least 25 μm, a distance in the in-plane direction between the lateral edge of the charge sheet layer and the lateral edge of the p-type semiconductor contact layer may be at least 2 μm. Alternatively, when the width of the charge sheet is less than 25 μm, a distance in the in-plane direction between the lateral edge of the charge sheet layer and the lateral edge of the p-type semiconductor contact layer may be at least 1 μm.

In this disclosure, the expression "width" is used in general to denote a dimension of the device in an in-plane direction. In-plane directions are those directions parallel to the main surface of a substrate (typically single crystal Si substrate) on which the device is formed. The expression "diameter" is used to denote the width of certain features of the device, typically features having an island configuration. The use of the expression "diameter" does not necessarily indicate that the feature has a circular shape in plan view (although this is possible and may in some cases be preferred). The feature may have a square, rectangular, rounded square or rounded rectangular, elliptical, racetrack or other comparable shape in plan view, and its "diameter" is intended to denote its width in an in-plane direction of interest.

The charge sheet layer typically has a doping concentration that varies with depth from the surface of the Si-based avalanche layer. Therefore, it is possible to identify a depth corresponding to the depth of maximum doping concentration. Preferably, the charge sheet layer has a maximum doping concentration at a depth in the range 30-100 nm from the surface of the Si-based avalanche layer. It is considered that this configuration helps to avoid loss of dopants through diffusion to the surface and subsequent cleaning before deposition of the Ge-based absorber layer.

The Si-based avalanche layer may be at least 0.5 μm thick. Preferably it is at least 1 μm thick and may be up to 2 μm thick.

The Si-based avalanche layer may be i-Si.

The n-type semiconductor contact layer may be n++Si.

The Ge-based absorber may be i-Ge. The Ge-based absorber may comprise i-Ge. The Ge-based absorber may comprise at least 80% Ge, at least 85% Ge, at least 90% Ge, at least 95% Ge, or at least 99% Ge. The Ge-based absorber may be a Ge alloy-based absorber layer. The Ge alloy-based absorber may comprise an alloy of Ge with Sn (tin), Si (silicon) or C (carbon). For example, the Ge alloy-based absorber may comprise $Ge_xSi_{1-x}$, $Ge_{1-x}Sn_x$, $Ge_xSi_{1-x-y}Sn_y$, or $Si_{1-x}Ge_xC_y$.

The p-type semiconductor contact layer may have a thickness in the range 10-100 nm. The p-type semiconductor contact layer may be p++ Ge.

At least one upper and/or side surface of the Ge-based absorber layer may be passivated. This passivation may be provided by a $GeO_2$ layer. This may, for example, be thermally grown. The $GeO_2$ layer may be protected by an $Al_2O_3$ layer. A suitable $Al_2O_3$ layer may be deposited by atomic layer deposition. The $Al_2O_3$ layer may help to prevent the $GeO_2$ layer being etched by water from the atmosphere.

The lateral edge of the charge sheet layer can be defined as the position of 0.5 times the maximum dopant concentration in the charge sheet layer, in a plot of dopant concentration varying with in-plane distance from the maximum dopant concentration in the charge sheet layer to the dopant concentration in the avalanche layer.

Typically, the p-type semiconductor contact layer is formed by lithography. The contact layer may be formed with etching or implantation. A lateral edge of the p-type semiconductor contact layer may be defined as the lateral position corresponding half of the maximum height of the p-type semiconductor contact layer from the Ge-based absorber layer.

Preferably, the Ge-based absorber has sidewalls in at least one in-plane direction, the width Ge-based absorber being measurable from one sidewall to another.

In general terms, it is preferred that the device has a separate absorption charge and multiplication (SACM) architecture.

Preferably, the device has a dark count rate (DCR) at 100 K of less than 100 counts/s/$μm^2$.

Preferably, the device has a single photon detection efficiency (SPDE) of at least 10% at 100 K for a photon with wavelength 1.3-1.45 μm.

Preferably, the device has a noise equivalent power (NEP) of not more than $2\times10^{-15}$ W/$Hz^{1/2}$ at 78 K. Preferably, the device has a noise equivalent power (NEP) of not more than $3\times10^{-15}$ W/$Hz^{1/2}$ at 100 K.

Preferably, the device has a noise equivalent power (NEP) of not more than $7\times10^{-15}$ W/$Hz^{1/2}$ at 125 K.

In the SPAD array, it is preferred that the SPAD devices have a planar architecture. This is in preference to a mesa architecture.

In the SPAD array, it is preferred that the array has at least 2×2 SPAD devices, at least 4×4 SPAD devices, or any other suitable array of SPAD devices, optionally including large numbers of SPAD devices such as for imaging applications.

In the SPAD array, the respective Ge-based absorber layers of adjacent SPAD devices may be laterally isolated by:
- (i) etching of a continuous Ge-based absorber layer to at least the depth of the p-type charge sheet layer in order to form the respective Ge-based absorber layers of adjacent SPAD devices; or
- (ii) doping of a continuous Ge-based absorber layer to at least the depth of the p-type charge sheet layer in order to form the respective Ge-based absorber layers of adjacent SPAD devices; or
- (iii) selective area growth of the respective Ge-based absorber layers within patterned electrically insulating layers in order to form the respective Ge absorber layers of adjacent SPAD devices.

With respect to (iii) above, it is noted that selective area growth can be advantageous to reduce dislocation density at the Si—Ge hetero interface.

The SPAD array (or SPAD device) may be mounted on a Peltier cooler for use. It is preferred for low-cost embodiments, to use a Peltier cooler in order to maintain the SPAD device at a suitable operating temperature.

It is preferred that the SPAD device is used in the detection of at least one photon with wavelength in the range 0.9 μm-2.0 μm, or in the range 1.3-1.7 μm. The present inventors observe that there is improvement in the indirect absorption tail out to 1.7 μm.

In use, as will be understood for SPADs, the device is biased above its avalanche breakdown voltage. This is in contrast to the related but different class of devices known as avalanche photodiodes (APDs). After detection of a photon, the SPAD device is typically quenched by reducing the bias to below the breakdown voltage and reset by subsequently increasing the bias to above the breakdown voltage.

In the method of manufacture of the device, the charge sheet layer may be activated by annealing at a temperature of at least 850° C., before deposition of the Ge-based absorber layer.

The invention includes the combination of the aspects and preferred or optional features described except where such a combination is clearly impermissible or expressly avoided. Further optional features of the invention are set out in the remainder of this disclosure.

The preferred embodiments of the present invention provide the significant advantage of allowing germanium on silicon single photon avalanche detectors (SPADs) to be fabricated on a planar process using silicon foundries. This enables the technology to be fabricated in a complementary metal-oxide semiconductor (CMOS) or micro-electromechanical system (MEMS) foundry with the potential to integrate electronics on the same die. As discussed in more detail below, this new approach to the design and fabrication has demonstrated a single-photon detection efficiency (SPDE) of up to 38% at 125 K at 1310 nm which is nearly an order of magnitude improvement on the previous best Ge-on-Si SPAD devices [29][28][30]. 100 μm diameter devices operate up to 175 K and scaling to smaller sizes allows operation on Peltier coolers, as used by the present commercial InGaAs/InP SPAD devices. The SPDE performance is comparable or greater than commercially available InGaAs/InP SPADs whilst the DCR is considerably lower than any other Ge-on-Si SPADs [29], it is still higher than the state-of-the-art InGaAs/InP SPADs [44]. The DCR is approximately proportional to the area of the device and therefore scaling to smaller diameter devices advantageously reduces the DCR.

SUMMARY OF THE FIGURES

Embodiments and experiments illustrating the principles of the invention will now be discussed with reference to the accompanying figures in which:

FIG. 1 shows a schematic diagram of a device according to an embodiment of the present invention.

DETAILED DESCRIPTION OF THE INVENTION

Figure 2A:
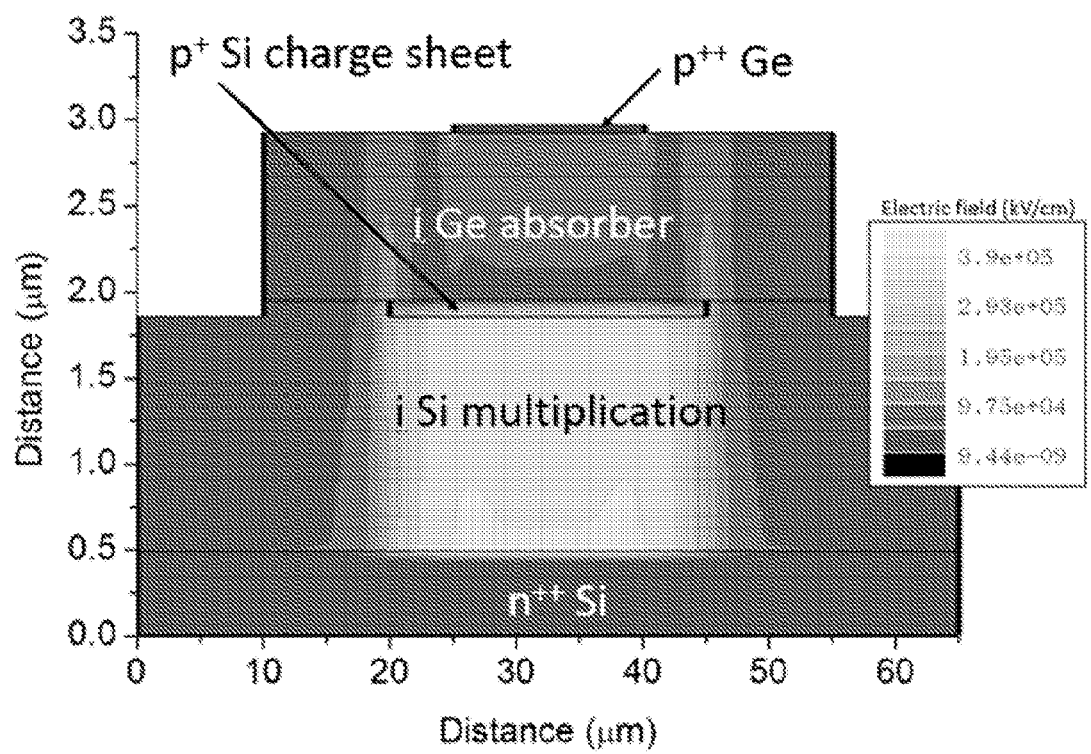
FIGS. 2(a) and (b) show a simulated electric field profile of a planar device (Design 1) according to an embodiment of the present invention.

Aspects and embodiments of the present invention will now be discussed with reference to the accompanying figures. Further aspects and embodiments will be apparent to those skilled in the art. The contents of all documents mentioned in this text are incorporated herein by reference. Such documents are listed and numbered at the end of the description, and are indicated in the text below using square brackets.

Introduction and Overview

We have designed, fabricated and characterised a new generation of planar Ge-on-Si single-photon avalanche detectors (SPAD) for use in picosecond resolution timing applications in the wavelength region of 0.9 µm-2.0 µm. Use of this novel planar geometry has enabled a significant step-change in performance of this class of single-photon detector, allowing large excess biases above avalanche breakdown to be applied and resulting in single-photon detection efficiencies (SPDE) of 38% at 125 K and a detection wavelength of 1310 nm. This compares favourably to the alternative semiconductor-based single-photon detectors operating in this wavelength region and, combined with low dark count rates (DCR), leads to a record low noise equivalent power (NEP) for Ge-on-Si SPADs of $2 \times 10^{-16}$ WHz$^{-1/2}$, a fifty-fold improvement over the previous best result. For the first time, InGaAs/InP and Ge-on-Si SPADs have been compared under similar operating conditions, with the Ge-on-Si SPADs exhibiting considerably lower afterpulsing effects, indicating the potential for use at very high count rates. These results, utilising the inexpensive Ge-on-Si platform, provide a route towards the development of large arrays of high efficiency, high count rate Ge-on-Si SPADs operating at telecommunication wavelengths for use in eye-safe automotive and autonomous vehicle LIDAR and a range of future quantum technology applications.

Compact, near room temperature semiconductor-based single-photon detectors (SPAD) have become the accepted optical detection approach in a variety of emerging application areas in the visible and short-wave infrared spectral regions [1][2][3]. SPAD detectors are avalanche photodiodes biased at fields above avalanche breakdown, in Geiger mode, where a self-sustaining avalanche current can be triggered by an incident single-photon. After the photo-induced avalanche, the detector must be reset, or be "quenched", before the next detection event. Such detectors typically have a temporal jitter of hundreds of picoseconds, allowing ultra-sensitive measurement of fast optical transients. At wavelengths below 1 µm, silicon-based SPADs have been used in a range of quantum photonic applications, including experiments in quantum foundations [4] and in fibre and free-space quantum communications demonstrations [5][6]. In more traditional application areas, such as Light Detection And Ranging (LIDAR), Si-based SPAD detectors have also emerged as a candidate technology due to the high sensitivity and the picosecond temporal response which has resulted in enhanced range and improved surface-to-surface resolution [7]. Si SPAD detectors have been integrated with standard Si CMOS processes to produce ultra-sensitive, large format detector arrays with integrated electronics [8]. This low cost technology has allowed time of flight systems to be adapted and developed for use in the automotive [9][10][11] and smartphone industries [12].

There are a number of clear advantages in extending the spectral range of SPAD detectors into the short-wave infra-red (SWIR) region, beyond the detection spectrum of Si-based SPADs. Firstly, compatibility with the optical fibre low-loss telecommunications windows is a fundamental requirement of most fibre-based applications including quantum communications. Secondly, in free-space applications such as LIDAR and range-finding, the optical power of the laser source is limited to relatively low levels due to laser eye safety thresholds. This threshold increases by approximately a factor of twenty when the laser wavelength is increased from 850 nm to 1550 nm [13], permitting increased optical power whilst maintaining eye-safety in active imaging applications. Consequently, this results in an increased maximum range attainable and/or potential improvements to depth resolution. Thirdly, solar radiation, which typically acts as the background level in most single-photon LIDAR systems, decreases considerably in the SWIR [14]. Finally, operation in the SWIR will mean enhanced atmospheric transmission, especially through obscurants such as smoke, smog [15], fog and haze [16].

In the SWIR region, the most widely used single-photon detectors are InGaAs/InP SPADs and superconducting nanowire single-photon detectors (SNSPD) [1][2]. Generally, SNSPD devices have had superior single-photon detection performance, however the cryogenic operating temperatures, typically below 3 K, limit their use in certain key application areas. InGaAs/InP SPADs are the dominant single-photon detector in the SWIR region and have been used in a range of quantum communications experiments, notably in long distance quantum key distribution demonstrations [17]. Recently, InGaAs/InP SPADs have been used in LIDAR and depth profiling experiments to good effect in the kilometre range [18][19]. Arrays of InGaAs/InP SPADs have been developed and give high performance detection at telecommunications wavelengths [20], however two-dimensional arrays may prove expensive for the low cost, high volume automotive and autonomous vehicle LIDAR markets. One issue that has made use of InGaAs/InP SPADs challenging has been the effect of afterpulsing—described below—which has severely limited the count rates possible of these SPADs in a number of different application scenarios.

One alternative to the use of InGaAs absorber layers is the use of the semiconductor material Ge. At room temperature, Ge is sensitive to incident radiation with wavelengths of up to 1650 nm and can be integrated with Si CMOS [21] with the potential for integrated electronics, high yield and low cost at volume. SPADs fabricated entirely from Ge have been used for laboratory-based single-photon applications, such as time-resolved photoluminescence [22] but the narrow direct bandgap of Ge of about 0.8 eV meant the avalanche gain was limited by band-to-band tunnelling. The first Ge containing SPAD with a Si avalanche region was reported by Loudon et al. [23], using $Si_{0.7}Ge_{0.3}$/Si multiple quantum wells to absorb the 1210 nm radiation. The efficiency and wavelength range of that detector was limited by the use of a relatively thin, strained superlattice absorbing layer. Although this detector had a poor efficiency in the short-wave infrared, it was an early example of a separate absorption, charge and multiplication (SACM) structure for Si-based SPAD detectors, and conceptually similar to previous SACM designs used in InGaAs/InP SPADs and avalanche photodiodes. The $Si_{0.7}Ge_{0.3}$ absorber region has a low electric field in order to avoid tunnelling and impact ionisation, with the thin Si charge sheet allowing a much larger electric field in the Si multiplication layer. The large direct Si bandgap of 3.66 eV (3.53 eV) at 300 K (78 K) [24] significantly reduces the noise from band-to-band tunnelling in the high-field avalanche region which is essential for high performance SPADs. Over the last ten years, it has been possible to grow much thicker epitaxial Ge layers on Si substrates. Kang et al. presented a monolithic Ge-on-Si avalanche photodiode (APD) operating with a high gain bandwidth product [25]. CMOS compatible Ge waveguide photodiodes [26] and APDs [27] have also been developed. Geiger mode Ge-on-Si SPADs were presented by Lu et al. [28] and Warburton et al. [29], the latter reporting a noise equivalent power (NEP) of $1 \times 10^{-14}$ $WHz^{-1/2}$ at 100 K using a detection wavelength of 1310 nm. More recently, a waveguide Ge-on-Si SPAD was fabricated by Martinez et al. [30], with a reported single-photon detection efficiency (SPDE) of 5.27% at a wavelength of 1310 nm and 80 K. Although promising, none of these SPADs have performance that is sufficiently close to the InGaAs/InP SPAD alternative, and have dark count rates that prohibit their effective use in many applications.

To date, normal-incidence Ge-on-Si SPADs have used mesa designs where the sidewalls of the device were exposed. The present inventors have realised that this has placed severe limitations on detector performance due to surface effects resulting in prohibitively high dark count rates. The present inventors have further realised that these limitations can be avoided by using planar designs where the high field regions are located well away from any sidewalls, mitigating the requirement for high quality passivation layers. Here we report on the first normal incidence, planar Ge-on-Si SPAD, and demonstrate high performance operation, illustrating clear potential for integration with Si CMOS for low cost, high performance SPAD array imaging in the SWIR bands.

Design, Fabrication and Characterisation Results

FIG. 1 shows a schematic cross-section of a device according to the invention having the following features denoted by reference numbers:

1—$p^{++}$ Ge top Ohmic contact layer;
2—i-Ge absorber;
3—p-doped Si sheet charge layer;
4—i-Si avalanche gain multiplication region;
5—bottom $n^{++}$ Si Ohmic contact layer;
6—silicon substrate;
7—electrical insulator such as $SiO_2$, $Si_3N_4$, $SiO_xN_y$, hydrogen silsesquioxane, TEOS, BPSG, polyimide, benzocyclobutene based polymers or other;
8—metal interconnect to the top electrical contact of the Ge on Si SPAD device;
9—metal interconnect to the bottom electrical contact of the Ge on Si SPAD device;
10—the lateral distance between the outside of the top Ohmic contact layer (1) and the outside of the p-doped sheet charge layer (3);
11—the thickness of the Ge absorber;
12—the distance between the outside edge of the doped sheet charge layer (3) and the outside edge of the Ge absorber layer (2);
13—the thickness of the i-Si avalanche multiplication gain region;
14—the width of the doped sheet charge layer (3).

Although not shown, the device may further include an anti-reflective coating (ARC—such as silicon nitride or other transparent materials with a refractive index of about 2); a graded etch of the top Ohmic contact layer to reduce hot spots; the doped sheet charge layer (3) may be embedded a non-zero distance from the Ge—Si heterointerface.

Without wishing to be bound by theory, the present inventors suggest that the features discussed below, singly or more preferably in combination, provide technically significant differences in comparison to known devices.

Firstly, the use of a selective area implanted sheet charge layer 3 covering a specific section of the active device. This provides lateral confinement of the high field Si avalanche region and helps laterally confine the field within the Ge absorber. After implantation, this sheet charge layer 3 is activated by annealing at 950° C. before epitaxially growing the Ge absorber 2 and top p++ contact layer 1 on top. This approach allows high levels of activation of the dopant in the supply layer using temperatures above the melting point of Ge to reduce point defects which could increase the DCR. The sheet charge layer 3 was implanted to have a maximum doping at about 60 nm below the silicon surface so that very little dopants will be lost through diffusion to the surface and subsequent cleaning before the growth of the Ge absorber.

Secondly, the design of a planar device process where selective area doping 3 is combined with a germanium absorber 2. The germanium layer is then etched to approximately the depth of the charge sheet in a "superpixel" design, where the size of the pixel is greater than that of the charge sheet. The distances 12 and 10 are preferably greater than the Ge thickness 11 (approximately 1.1 μm deep in the demonstrated devices), in order that the electric field at the "superpixel" sidewall is close to zero, to reduce the contribution to the DCR from sidewall surface states. This results in a reduction in the dark count rate (DCR) by a factor of 700 for the same area, temperature and voltage overbias compared to published mesa devices [29]. The reduction in dark current before avalanche breakdown (FIG. 4) and DCR (FIGS. 6, 7 and 8 for 78 to 125 K) allows the device to operate with significantly higher single photon detection efficiency (SPDE) as demonstrated in FIGS. 6, 7 and 8. This corresponds to a factor of 10 improvement in SPDE over the previous mesa devices [29] with the new planar device design and process. The electric field modelling shown in FIGS. 2 and 3 discussed below illustrate that design 1 has significantly lower electric-field at the sidewalls.

Thirdly, the Ge absorber 2 being regrown on top of the implanted silicon 3, 4. This Ge absorber can be a bulk epitaxially grown layer or a selective grown epitaxial layer inside patterned electrical insulating (e.g. silicon dioxide or silicon nitride) layers 7—see FIG. 9. The selective area approach also provides lateral electrical isolation of the devices allowing arrays to be realized. Test arrays of 4×4 have been produced which demonstrate this isolation. This use of the "super-pixel" design for the Ge absorber which is larger laterally than the charge sheet layer 3 and the top p++—Ge Ohmic contact layer 1 is designed to minimize hot spots in the device avalanche region which lead to the early onset of avalanche breakdown at the edges for the device (i.e. edge breakdown). Hot spots will reduce the SPDE as the device will have a lower efficiency in the center of the active region, and effectively force the device to be operated at higher bias levels, resulting in high dark count rates.

Fourthly, an alternative method to electrically isolate pixels, after bulk Ge epitaxial growth of the absorber. This means etching the superpixel sidewalls through the entire depth of the Ge-layer 2 to provide lateral electrical isolation between pixels. This is similar to shallow trench isolation as the high intrinsic carrier density of germanium combined with typical background doping levels (>$10^{15}$ cm$^{-3}$) requires a method to laterally electrically isolate devices. The etched edge of the trench is preferably located at a lateral distance from the active region of the device of at least the depth of the Ge heterolayer 2. The active region can be considered in view of the electric field profile between the p++ surface Ohmic contact 1 and the buried p-type sheet charge layer 3. This approach aims to prevent any trapped charge from surface states being accelerated by the electric field into the avalanche region, which otherwise increases the dark current and DCR. Alternatively, doping can be used to form lateral p-n electrical isolation.

Figure 10:
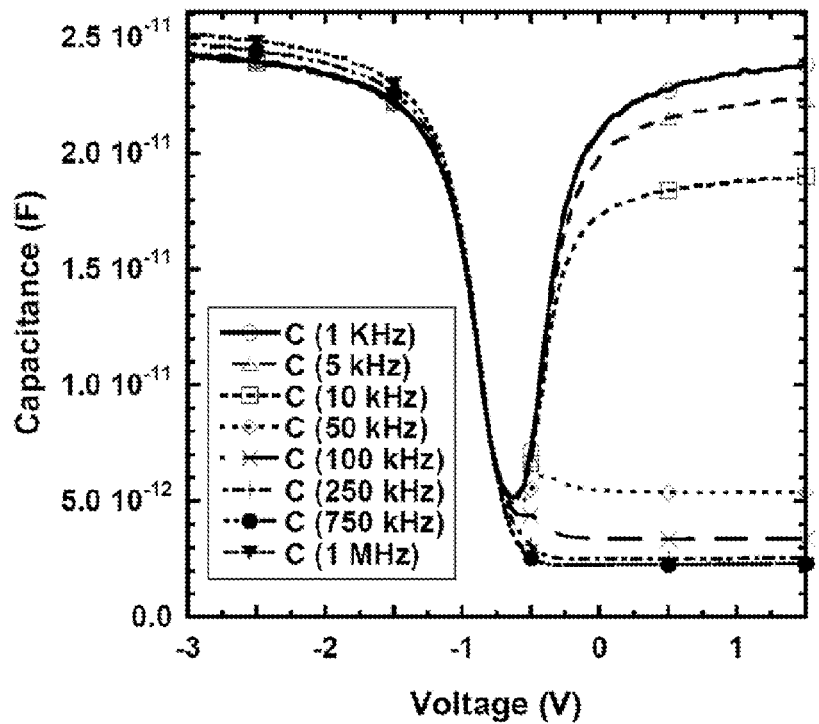
FIG. 10 shows the capacitance-voltage behaviour of the $GeO_2$ passivation process on flat Ge surfaces using a thermal oxidation with atomic layer deposition $Al_2O_3$ protective cap.

Fifthly, the use of a thermally grown $GeO_2$ (not shown) on the Ge surface 2 and etched surfaces to produce a passivated Ge surface. In some embodiments, this $GeO_2$ was protected by an atomic layer deposition $Al_2O_3$ layer to prevent the $GeO_2$ from being etched by water from the atmosphere. FIG. 10 provides the electrical characterisation of the passivation using the same thickness of $GeO_2$ and $Al_2O_3$ layers as part of a 100 μm diameter capacitor. The CV demonstrates trapped charge levels around $10^{11}$ cm$^{-2}$.

Figure 9:
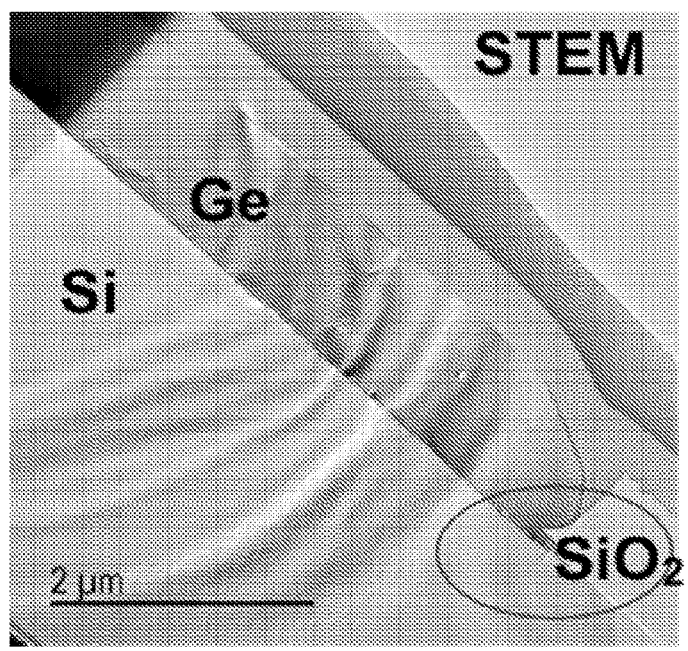
FIG. 9 shows a scanning transmission electron microscope (STEM) image of a selectively grown Ge absorber on top of Si inside windows etched into a S102 mask. Whilst misfit dislocations (black dots) are evident at the heterointerface between the Si and the Ge, no threading dislocations are evident on the 10 μm wide Ge pixel. The buckling shown across parts of the Si and Ge layers are caused by residual strain due to the transmission electron microscope (TEM) sample forming process.

Sixthly, using limited area growth to reduce the number of dislocations to reduce the dark current and DCR in the device. FIG. 9 through the lack of any dark threading dislocation lines running from the Si—Ge heterointerface to the surface of the Ge demonstrates how limited area growth can reduce the threading dislocation density. This may help further reduce or eliminate the deleterious effects of afterpulsing if it is shown that the trapped charge responsible for this effect are associated with the dislocations.

Figure 2B:
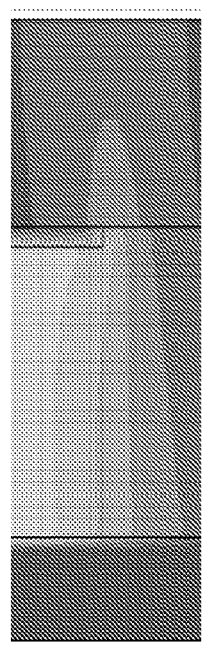

The embodiment devices described herein generally use the SACM structure modelled in FIGS. 2(a) and (b), otherwise referred to herein as 'Design 1'. Design 1 is a device having the p-Ge contact with a smaller diameter than the p-Si sheet charge layer and the i-Ge absorber much wider than both. The electric field profile suggests this device will have a relatively low dark current and dark count rate. Note that in FIG. 2a, the horizontal axis is not to the same scale as the vertical axis. FIG. 2b shows a portion of the device shown in FIG. 2a, but with the horizontal scale expanded compared with FIG. 2a, in order to illustrate more clearly the electric field strength mapping in the region of the device corresponding to the edge of the p+Si charge sheet.

Figure 3A:
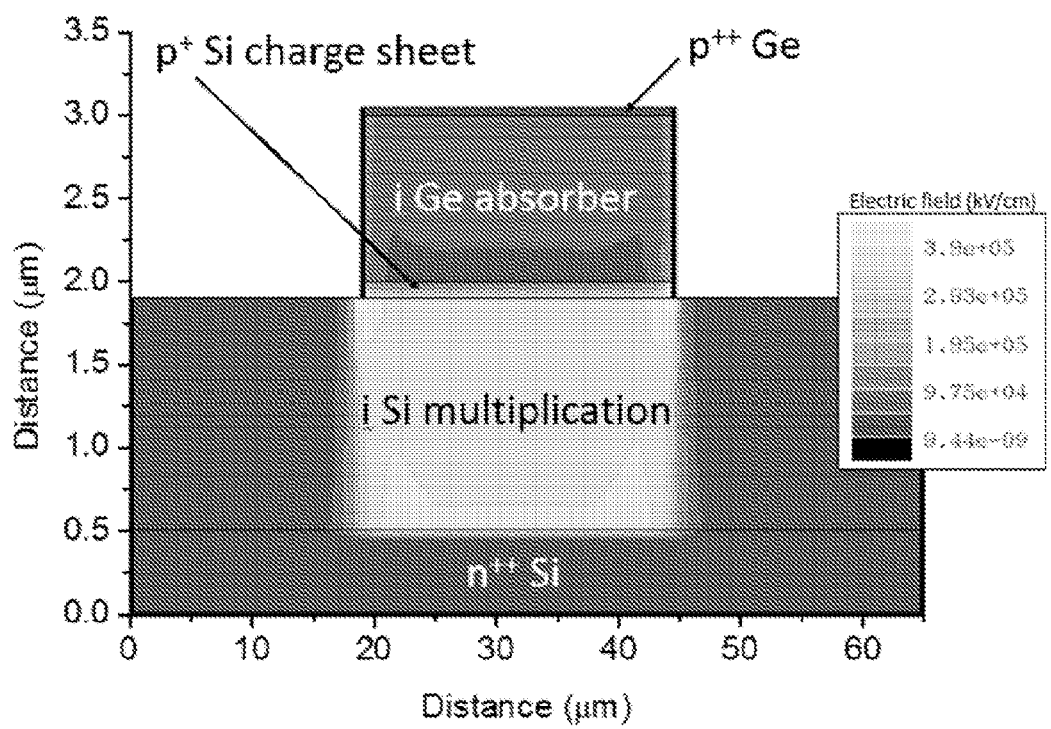
FIGS. 3(a) and (b) show a simulated electric field profile of a comparative mesa device (Design 2).

A comparative mesa structure is shown in FIGS. 3(a) and (b), otherwise referred to herein as 'Design 2'. Design 2 is a device having the p-Ge contact the same diameter as the i-Ge absorber and both having a smaller diameter than (or optionally the same as) that of the p-Si sheet charge layer. The electric field profile indicates high electric field hot spots on the sides of the etched Ge mesa suggesting an early onset of avalanche (i.e. edge breakdown) which will reduce the SPDE and effectively force the device to be operated at higher bias levels, resulting in high dark count rates.

For the design 1 device (and indeed for the design 2 device), the incident SWIR radiation is absorbed in the Ge absorption region and the signal amplification takes place in the Si multiplication region. In between these regions a charge sheet is used to modulate the electric field so that the field is high enough in the multiplication region to ensure excited carriers cause avalanche breakdown and low enough in the absorption region to prevent band-to-band and trap-assisted tunnelling. A modest electric field, however, is maintained in the Ge layer to allow efficient drift of photo-generated electrons into the multiplication region. The SPAD is biased above the avalanche breakdown voltage and the process begins when an incident photon is absorbed in the Ge absorption region, creating an electron-hole-pair. The photo-excited electron then drifts under the modest electric field until it reaches the Si multiplication region. Here it accelerates under the high electric field, gaining sufficient kinetic energy to undergo impact ionisation, creating an electron-hole-pair. The secondary electrons and holes are in turn accelerated and impact ionise, creating further electron-hole pairs. The process continues, creating a large avalanche current which can be self-sustaining if the device is biased above avalanche breakdown. Under these conditions, this results in a detectable electronic signal which can be timed relative to the initial laser pulse. After detection, it is necessary to bias the SPAD momentarily below avalanche breakdown to quench the avalanche, after which the SPAD can return to its quiescent state ready to detect further incident photons. The design 2 device operates in a generally similar manner.

Finite element analysis modelling using Silvaco ATLAS software was used to design the SPADs as shown in FIGS. 2a and 2b. The charge sheet doping levels and the thicknesses of the multiplication and absorber regions were determined, as well as the preferred overall design dimensions of the SPAD. This was necessary to ensure that the electric field profile throughout the SPAD was appropriate to give high performance, as discussed above. In the simulations shown in FIG. 2 for a planar device and FIG. 3 for the comparative mesa device, the electric field profiles are shown for a potential held at 5% above the avalanche breakdown voltage, or 5% excess bias. It is clear from FIGS. 2a and 2b that there is a low electric field in the Ge absorber at breakdown, and the high electric field is confined to the centre of the SPAD, preventing carriers originating at the sidewalls from causing breakdown events.

The superpixel radius minus the charge sheet radius (identified as Dimension 12 in FIG. 1) should preferably be approximately 2 μm or greater in order to minimise electric field at the sidewall and reduce electric field hot-spots just below the corner at the lowest part of sidewall, identified as Point A in FIG. 1. For very thin Ge absorbers (Dimension 11 in FIG. 1) it may be possible to reduce Dimension 12 to slightly less than 2 μm. If the Ge absorber is thicker than 1 μm, the following equation gives a suitable minimum value for dimension 12.

Dimension 12=dimension 11+1 μm

Preferably the contact layer has a smaller radius than the charge sheet, shown as Dimension 10 in FIG. 1. It is preferred that Dimension 10 should be greater than 2 μm. given typical device active regions of 25 μm or greater (active region defined as the diameter of the charge sheet, i.e. Dimension 14 in FIG. 1). Dimension 10 may be smaller than 2 μm when Dimension 14 is much smaller than 25 μm.

For characterisation of these devices, five structures were grown on 150 mm diameter $n^{++}$-doped Si substrates. Firstly 1.5 μm thick Si multiplication regions were grown by a commercial reduced pressure-chemical vapour deposition (RP-CVD) system. Photolithography was used to define the charge sheet regions which were then implanted with boron acceptors at an energy of 10 keV. Different charge sheet doses were implanted in each of the five wafers to account for fabrication tolerances and ensure that the optimised electric field profile was achieved. After implantation the boron dopants were activated at 950° C. for 30 s using a rapid thermal annealler. After RCA cleaning, 1 μm thick, nominally undoped Ge absorption regions and 50 nm p++Ge top contact layers were grown on top of the selectively implanted Si layer using RP-CVD. A trench etch though the Ge was performed at a lateral distance of 10 μm from the charge sheet, in order to electrically isolate the SPADs. This isolation was considered necessary in this embodiment due to the background doping level found in the Ge layer. A mesa design with exposed sidewalls, similar to that shown in FIG. 3a, was also fabricated and used as a control during characterisation. Metal contacts, $GeO_2$ passivation, anti-reflection (AR) coatings and bond-pads were subsequently deposited. To ensure quick and high yield fabrication, device diameters ranged from 100 to 200 μm, resulting in very large cross sectional areas compared to previous Ge-on-Si SPADs [28][29]. It is intended, however, that the present disclosure can be applied to SPADs that are significantly smaller than this—for example it would be suitable to use a device diameter of around 10 μm in order to reduce dark count rates further.

Figure 3B:
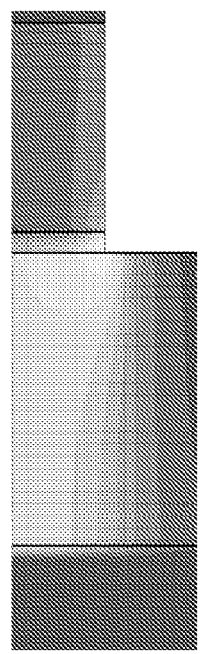
Figure 4:
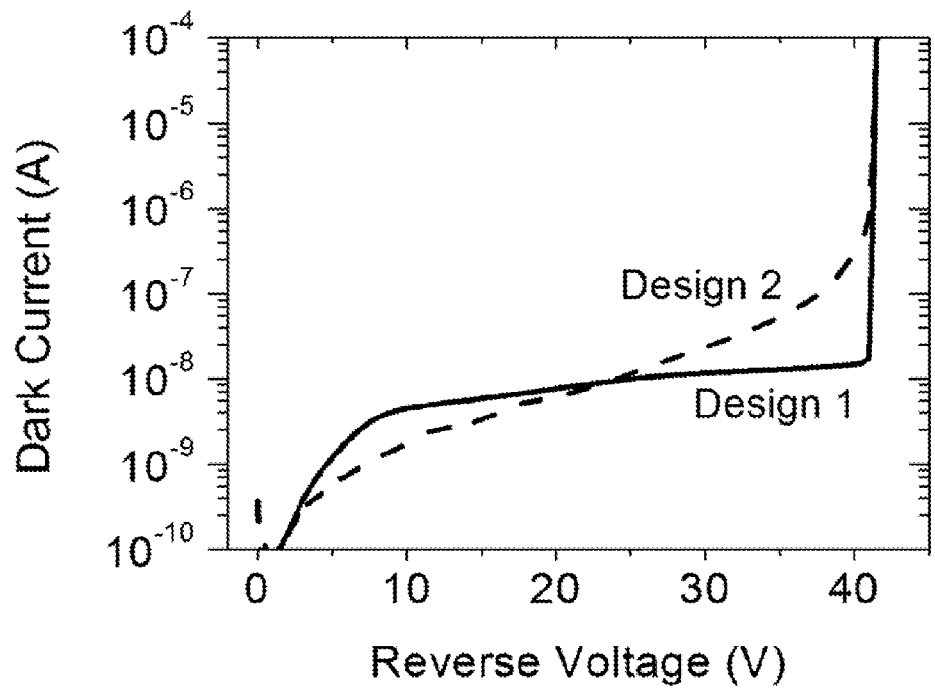
FIG. 4 shows the dark current at 100 K for the device shown in FIG. 2 (Design 1) and the device shown in FIG. 3 (Design 2).
Figure 5:
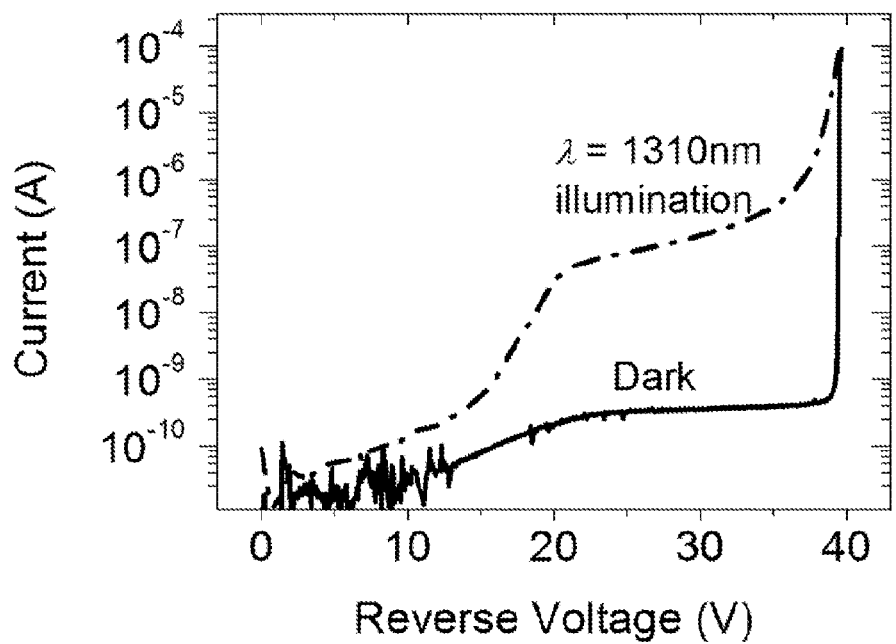
FIG. 5 shows the dark current and photocurrent response when illuminated with 1310 nm wavelength light at 78 K. Punchthrough of the sheet charge layer is evident at 20 V.

After fabrication, the SPADs were cooled in a Janis Micromanipulated Cryogenic Probe system. FIG. 4 illustrates the dark current at a temperature of 100 K for both the planar and mesa etched SPAD structures fabricated from the same wafer. The mesa etched structure has a similar microstructure to the planar geometry in FIG. 2, except that an etch process was used to create a mesa of diameter less than the diameter of the ion-implanted charge sheet, etched to a depth just below the charge sheet and into the multiplication layer (FIG. 3). The planar SPAD has a sharp breakdown indicating a low multiplied dark current, previously found to be a strong indicator of the desired low dark count rate performance [31] and demonstrating that surface generation effects are negligible, as predicted by the electric field modelling. The mesa etched SPAD has a much softer breakdown with a dark current 50 fold times higher than the planar structure immediately before breakdown. This indicates that, as expected on the basis of this disclosure, significant surface generation is present and suggests that it will have high dark count rates compared to the planar SPAD. Indeed, it was not possible to characterise the mesa etched SPAD above breakdown due to its prohibitively high DCR. FIG. 5 demonstrates the dark current and photocurrent of the planar SPAD as a function of reverse bias at 78 K. The dark current before breakdown is less than 1 nA and the SPADs exhibited good uniformity, with little variation in dark current between devices. Photocurrent measurements at λ=1310 nm demonstrate clear punchthrough at 20 V where the electric field reaches the absorption region and photo-excited electrons can drift into the multiplication region. The device yield was over 90%, which at this early stage, is very encouraging for the eventual realisation of Ge-on-Si SPAD focal plane arrays.

Figure 6:
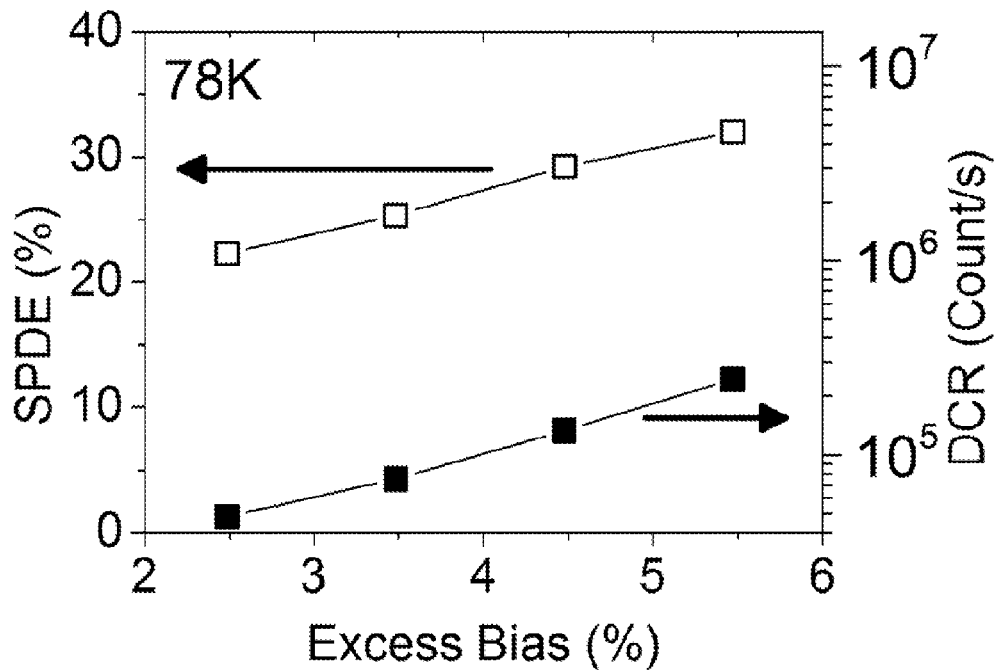
FIG. 6 shows the single photon detection efficiency (SPDE) and the dark count rate (DCR) at 78 K and 1310 nm wavelength for a 100 μm diameter Ge SPAD of design 1 which demonstrates a factor of 700 reduction in DCR compared to mesa devices (design 2).
Figure 7:
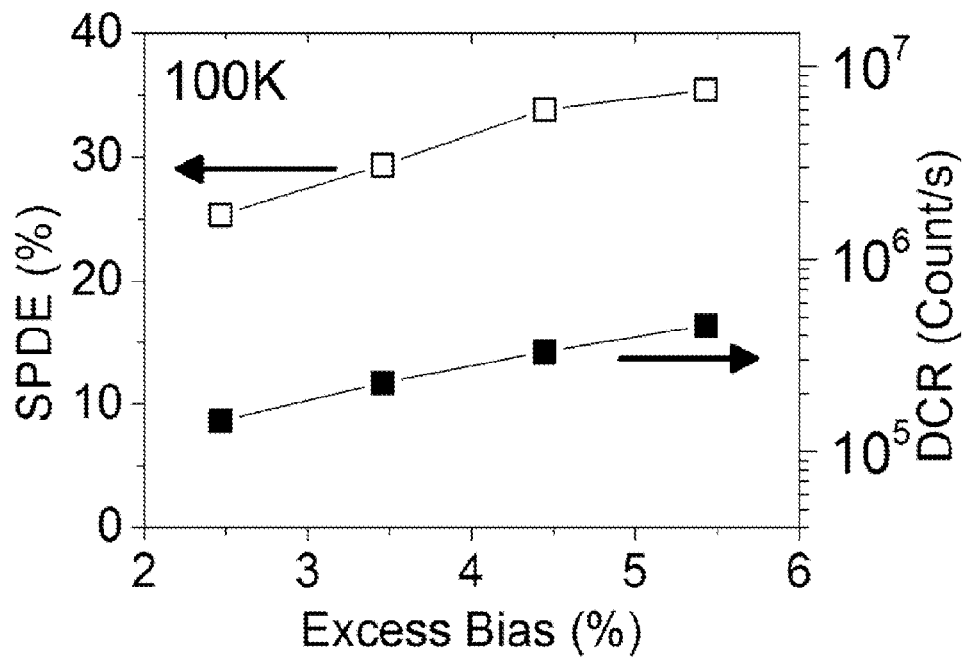
FIG. 7 shows the single photon detection efficiency (SPDE) and the dark count rate (DCR) at 100 K and 1310 nm wavelength for a 100 μm diameter Ge SPAD of design 1 which demonstrates a factor of 700 reduction in DCR compared to mesa devices (design 2).
Figure 8:
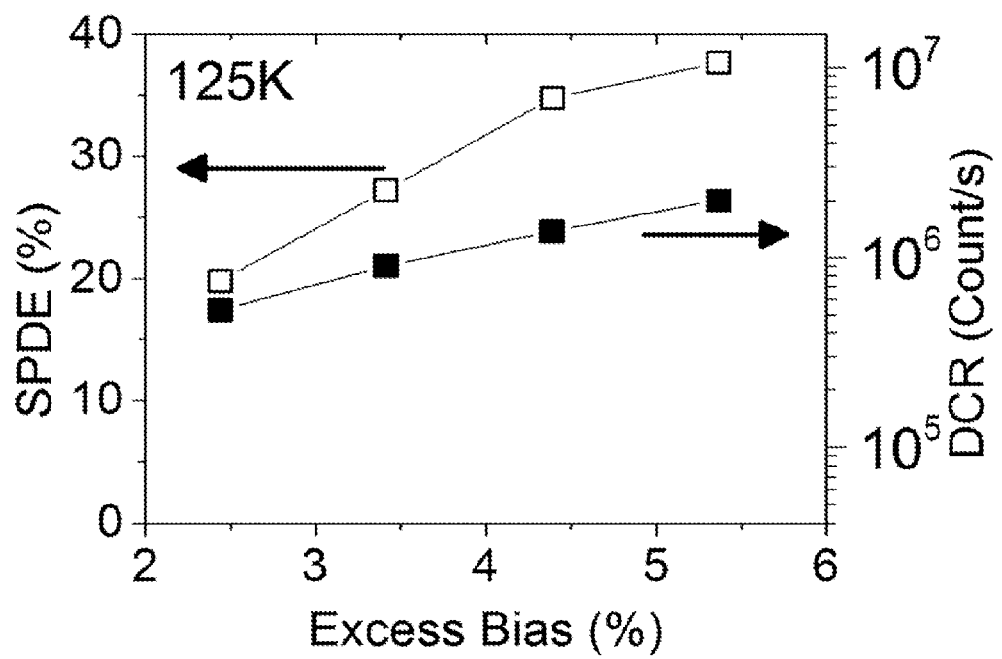
FIG. 8 shows the single photon detection efficiency (SPDE) and the dark count rate (DCR) at 125 K and 1310 nm wavelength for a 100 μm diameter Ge SPAD of design 1 which demonstrates a factor of 700 reduction in DCR compared to mesa devices (design 2).

After preliminary characterisation, SPDE, DCR and jitter measurements were taken using the time correlated single photon counting (TCSPC) technique, as described in more detail in the Methods section. In these measurements, an electrical gating approach was used to switch the detector to above avalanche breakdown, into the Geiger mode, for a duration of 50 ns in synchronisation with the arrival of the attenuated laser pulse. This gated detector approach was used at a low frequency of 1 kHz in order to fully quench the avalanche and avoid the effects of afterpulsing (described below). The SPAD detectors were initially cooled to 78 K for SPDE, DCR and jitter measurements using 2=1310 nm laser radiation. The SPDE and DCR as a function of excess bias at temperatures of 78 K, 100 K and 125 K are shown in FIGS. 6, 7 and 8. It should be noted that the detectors used had a large area (100 μm diameter), and it is fully expected that the DCR will be considerably lower with reduced area devices, as previously reported in all-Si SPADs [32].

The measured DCR demonstrates a vast improvement when compared to previous Ge-on-Si work. Warburton et al. reported on mesa geometry Ge-on-Si SPADs with a DCR of 5.5 MHz for a 25 μm diameter SPAD at a temperature of 100 K [29]. This corresponds to 11,200 counts/s/$μm^2$ which is approximately 3 orders of magnitude higher than the 18.3 counts/s/$μm^2$ reported in this work. It should also be noted that, under these conditions, the SPDE reported in that paper is 4%, compared to 26% for the SPAD reported herein. There is a similar relationship when our results are compared to results from Martinez et al., who reported a DCR of 500 kHz for a 1 μm by 15.9 μm rectangular waveguide SPAD at a temperature of 80 K [30]. This corresponds to 31,400 counts/s/$μm^2$ which is over 3 orders of magnitude higher than the 6.37 counts/s/$μm^2$ reported herein. They report an SPDE of 5%, compared to 22% for the SPAD reported herein. This considerable reduction in dark count rate has resulted from the carefully designed electric field profile of these planar geometry detectors which means that the high electric field is confined within the SPAD, preventing surface states contributing significantly to the DCR.

FIGS. 6, 7, and 8 demonstrate that the SPDE increases with excess bias to a maximum of 38% at 125 K, significantly higher than previous SPDEs reported for Ge and Ge-on-Si SPADs [22][28][29][30] and comparable to the highest values recorded for InGaAs/InP SPADs at 225 K [33][34][35]. This is due in part to the high excess bias applied across the SPAD, attainable due to the low DCR, increasing the breakdown probability in the multiplication region. The breakdown probability is also enhanced by the relatively thick 1.5 μm Si multiplication region, which reduces the probability that carriers will exit the multiplication region before impact ionisation and initiation of a breakdown chain. The uniform electric field in the multiplication region, caused by minimal residual doping in the lower part of the Si multiplication layer, results in an even impact ionisation rate throughout, increasing the breakdown probability still further. The optimised electric field also ensures that photo-excited electrons will drift into the multiplication region with a low probability of recombination. Significantly, there is no conduction band energy barrier between the Ge absorption region and the Si charge sheet ensuring the photo-excited electrons can easily pass from the Ge into the Si. Indeed the Si Δ-valley of the conduction band edge is 235 meV below the Ge L-valley conduction band edge in the absorber if calculated using the deformation potentials in reference [36]. This is an advantage over InGaAs/InP SPADs which possess an energy barrier step that photoexcited carriers must overcome to reach the InP multiplication region. These SPADs require an InGaAsP grading layer between the InGaAs and InP regions to reduce carrier accumulation at the absorber-charge sheet interface. It is preferred to include an AR coating on the device to reduce reflection from the top surface of the SPAD to less than 1% of the incident radiation. With these samples, measurements at higher temperatures were limited by the increasing DCR rate due to increasing thermal generation rates, however a reduction of the detector area reduces the DCR further and allow a significantly higher operating temperature.

The high SPDE has been achieved despite the use of a relatively thin Ge absorption region. Using absorption coefficients for single crystal Ge at 77 K [37] we have calculated that less than 50% of the 1310 nm wavelength radiation is absorbed in the 1 µm thick Ge absorber throughout the operational temperature range. Beer-Lambert's law indicates that a 2 µm thick Ge absorber will increase the absorption to over 70%, which leads to an SPDE of greater than 55% at 125 K. This figure is significantly higher than reported SPDEs for InGaAs/InP SPADs [33][34][35]. Even thicker Ge layers provide higher absorption still.

Noise equivalent power (NEP) is a figure of merit for SPADs calculated from the SPDE and DCR of the detector using $$NEP = \frac{hv}{SPDE}\sqrt{2DCR} \quad (1)$$

where h is Planck's constant and v is the frequency of the incident radiation. This can be used to compare detectors, with lower values indicating improved performance. At 78 K we have measured a record low NEP for a Ge-on-Si SPAD detector of $1.9 \times 10^{-16}$ W/Hz$^{1/2}$, fifty-fold lower than the NEP of the Ge-on-Si SPAD reported in [29]. NEP values of $3 \times 10^{-16}$ and $7 \times 10^{-16}$ WHz$^{-1/2}$ were calculated for temperatures of 100 K and 125 K respectively.

Figure 11:
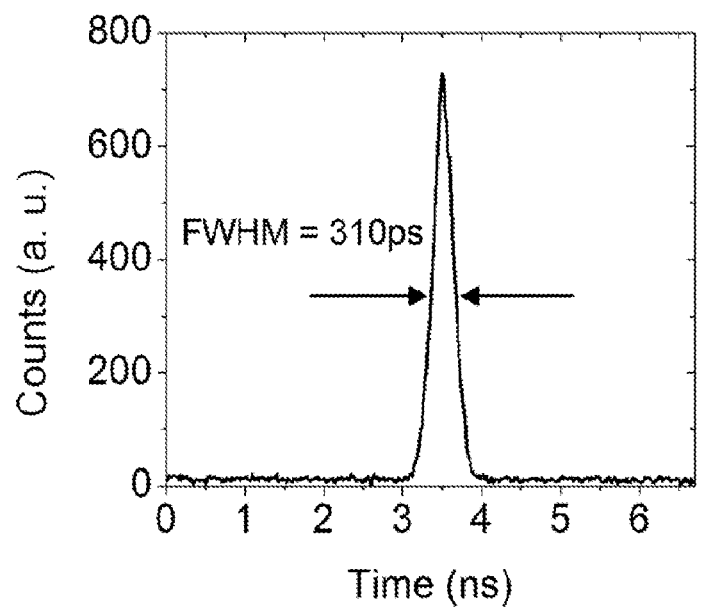
FIG. 11 shows a timing histogram for a 100 μm diameter SPAD at an excess bias of 5.5% and a temperature of 78 K with incident radiation at A=1310 nm. The full-width at half maximum (FWHM) jitter was 310 ps.

FIG. 11 shows a timing histogram taken at an excess bias of 5.5% and a temperature of 78 K when measured at λ=1310 nm. The jitter FWHM is 310 ps, which is a reasonable value considering the increased width of the multiplication region [38][39]. Wider multiplication regions generally improve the SPDE but the increased variance in the avalanche build-up time increases the jitter. It is expected that the jitter will reduce as the device diameter is decreased, as found previously in Si SPADs [40] and by improving the electronic packaging of the cooled device.

Figure 12A:
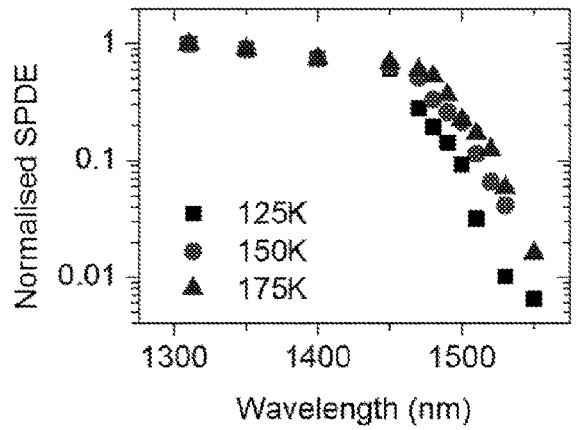
FIGS. 12a and 12b show Normalised SPDE as a function of incident wavelength for a 100 μm diameter SPAD at temperatures of 125 K (squares), 150 K (circles) and 175 K (triangles).
Figure 12B:
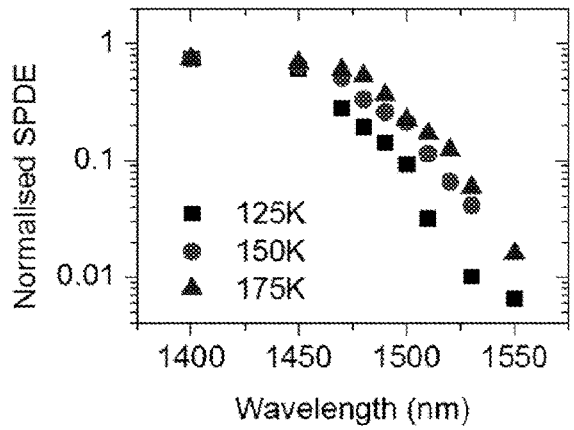
Figure 13:
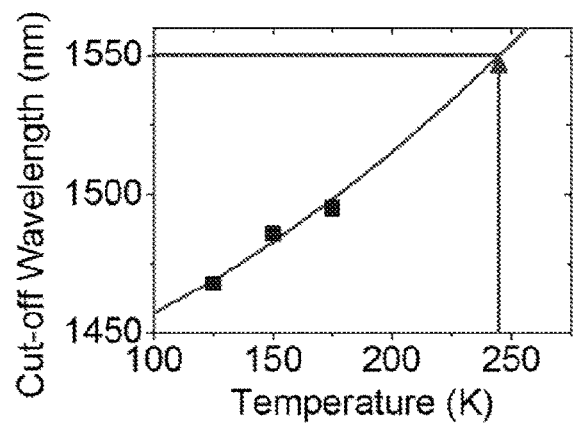
FIG. 13 shows experimental (squares) and theoretical (line) Ge cut-off wavelength as a function of temperature.
Figure 14:
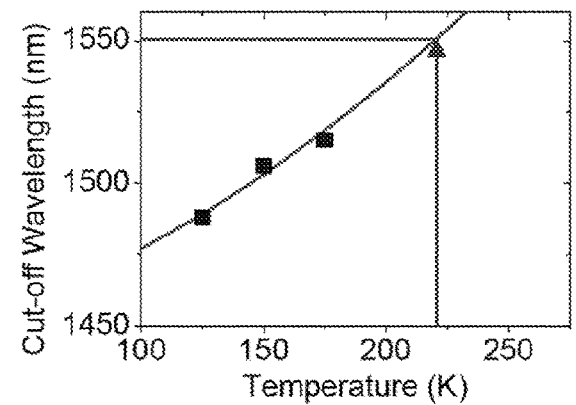
FIG. 14 shows estimated cut-off wavelength and fitting for a Ge-on-Si SPAD with a 2 μm thick Ge absorption region.

The wavelength dependence of the Ge-on-Si SPAD detector efficiency varies across the SWIR as the Ge band-gap changes with temperature. FIGS. 12a and 12b demonstrate the wavelength dependence of the SPDE of the Ge-on-Si SPAD as a function of temperature. The high efficiency SPDE region is related to direct bandgap absorption between the conduction band and the valence bands at the Γ-point. Absorption at longer wavelengths is related to significantly weaker indirect absorption into the L-valleys and the valence bands. At room temperature the direct bandgap of Ge is 0.80 eV [36] but this increases to 0.88 eV at 78 K, reducing the detection cut-off wavelength [36]. Using a tunable NKT Supercontinuum laser we were able to vary the wavelength of the radiation incident on the SPAD from 1310 nm to 1550 nm to obtain accurate cut-off wavelengths at various temperatures. By defining the cut-off wavelength, $\lambda_c$, as the wavelength at which the detector's SPDE is 50% of the 1450 nm wavelength value, it can be observed that $\lambda_c$ increases from 1468 nm at 125 K to 1495 nm at 175 K, increasing at a rate of approximately 0.54 nm/K, in agreement with values calculated using the Varshni temperature dependent bandgap parameters in [41], and shown in FIG. 13. The cut-off wavelength can be extended to reach the 1500-1800 nm atmospheric transmission window if the SPAD operating temperature is increased to above 180 K. This is considered to be readily achievable using smaller diameter devices possessing lower DCR rates and allowing higher temperature operation (as discussed above). In addition, increasing the Ge absorption region thickness increases the SPDE and shift $A_0$ to longer wavelengths. FIG. 14 shows estimated cut-off wavelengths for a Ge-on-Si SPAD with a 2 µm thick Ge absorption region. This has reduced the temperature required to detect 1550 nm wavelength radiation to 220 K.

One critical difference between Ge-on-Si SPADs and the InGaAs/InP SPAD alternative is considered to be a significant reduction in the deleterious effects of detector afterpulsing. Afterpulsing occurs when carriers are trapped after an avalanche event and then released later, resulting in an increased background level. This can be mitigated by using a long hold-off time (typically >10 ps) after each event in order that trapped carriers can be released prior to the detector being re-activated. This approach, however, increases the dead time and restricts the maximum count rate possible. Afterpulsing is recognised as one of the main limitations in the performance of InGaAs/InP SPADs, severely affecting their performance, even at modest count rates. Afterpulsing in InGaAs/InP detectors originate mainly in the InP multiplication layer from deep level trap states [42][43][44], and the expectation with Ge-on-Si SPAD detectors is that the high-quality Si multiplication layer will have a lower density of such states. For the first time, we show a comparison of an InGaAs/InP SPAD with a Ge-on-Si SPAD under similar operating conditions.

Figure 15:
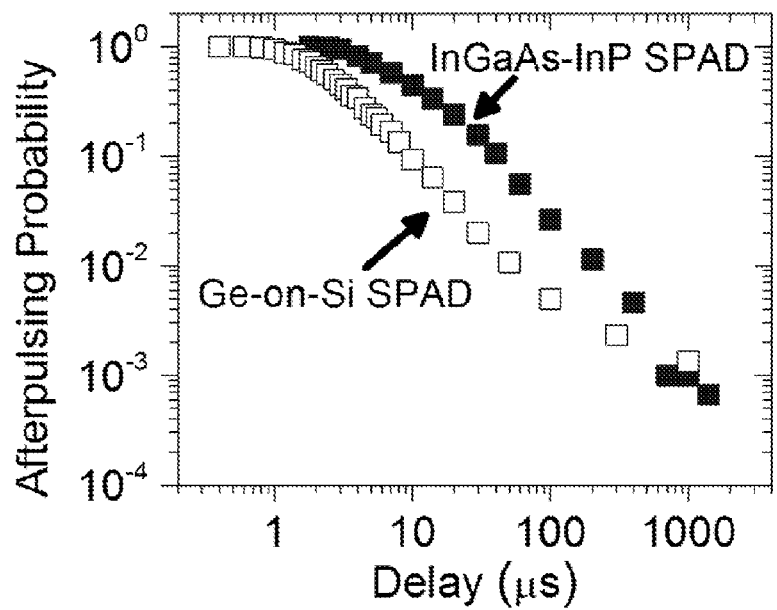
FIG. 15 shows afterpulsing probability as a function of gate delay time for a 100 μm diameter Ge-on-Si SPAD (open squares) compared to a 25 μm diameter commercially-available InGaAs/InP SPAD (closed squares) when measured at A=1310 nm and operated at a SPDE of 17% and a temperature of 125 K.
Figure 16:
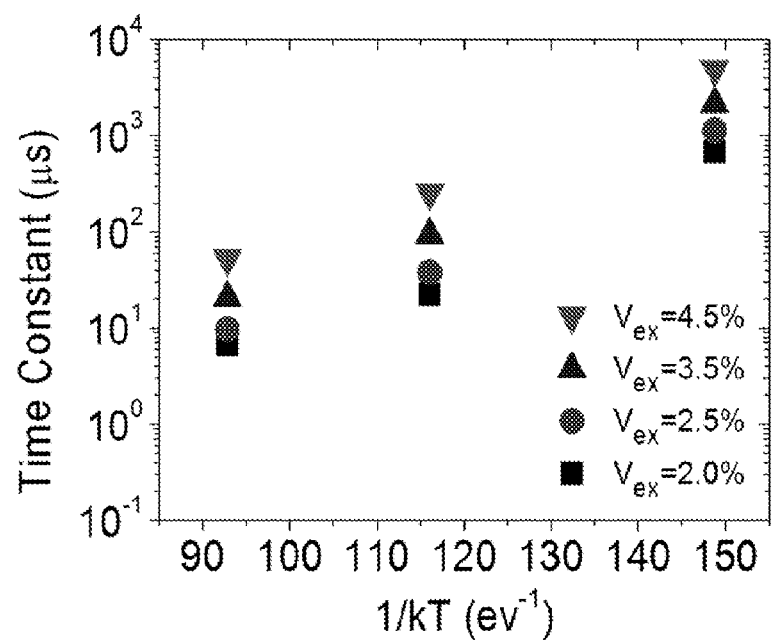
FIG. 16 shows time constants extracted from the Ge-on-Si SPAD afterpulsing probability as a function of 1/kT for excess biases of 2.0% (black squares), 2.5% (red circles), 3.5% (blue up triangles) and 4.5% (pink down triangles).

Afterpulsing measurements have been performed on a 100 µm diameter Ge-on-Si SPAD at temperatures between 78 K and 175 K using the time-correlated carrier counting method [45], where the SPAD undergoes an intentional avalanche. The device is then immediately quenched and then activated via an electrical gate for a second time shortly afterwards. By varying the time between the two detector gates, we examined the probability of an avalanche in the second gate, thus giving the afterpulsing probability as a function of time after the initial avalanche. The results obtained have been compared to a commercial state-of-the-art InGaAs/InP SPAD operating at identical temperatures and applying specific excess biases to each detector in order to obtain an identical SPDE for both detectors. FIG. 15 shows the variation in afterpulsing probability of the two SPADs at a temperature of 125 K when applying excess biases corresponding to a SPDE of 17% in both detectors. It can be observed that for a specific hold off time, the afterpulsing probability is significantly reduced for the Ge-on-Si SPAD. For instance, using a hold off time of 10 ps, the Ge-on-Si SPAD exhibits 20% of the afterpulsing probability of the InGaAs/InP SPAD detector. A similar trend is demonstrated at 150 K. It should be noted that although the absolute afterpulsing probabilities will be affected by the operating conditions, for example the gate duration, these results serve to provide a comparison between the two detector types under nominally identical operating conditions. These initial results demonstrate considerable promise for future Ge-on-Si development, and the improvement in afterpulsing probability will increase further as the Si epilayer material quality, in particular, is further developed to optimise this particular detector characteristic.

In an attempt to determine the afterpulse mechanism in Ge-on-Si SPADs, we examined the afterpulsing as a function of temperature in the range 78 K to 125 K, and fitted exponential decays. By fitting Arrhenius plots, we deduced activation energies in the region of 80-90 meV across a range of overbias levels to attempt to ascertain the origin of the traps. Native Si surfaces, native Ge surfaces and $GeO_x$ at Ge surfaces have been shown to have trap states close to 420 meV [46], 130 meV [46] and from 200 to 300 meV [47] respectively. This provides further evidence that the planar geometry is reducing the effects of traps and other impurities at the exposed surfaces. Hence the afterpulsing is unlikely to be related to surface states on the passivated Ge or any exposed Si surfaces.

Figure 17:
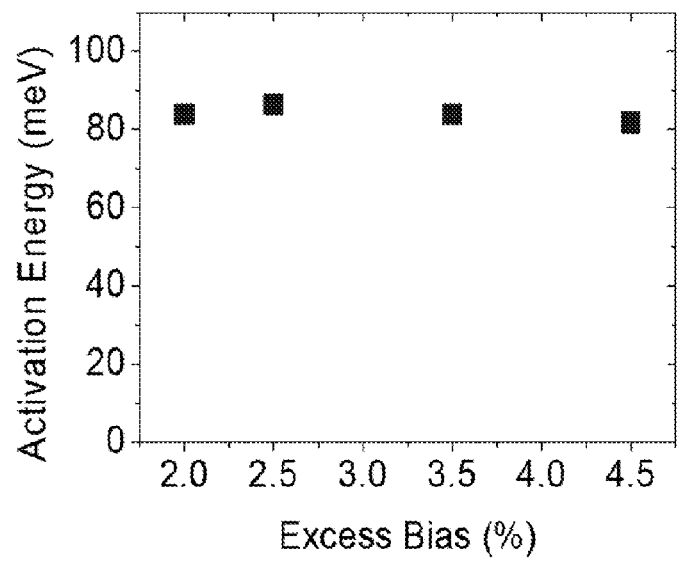
FIG. 17 shows activation energy for the Ge-on-Si SPAD as a function of excess bias.
Figure 18:
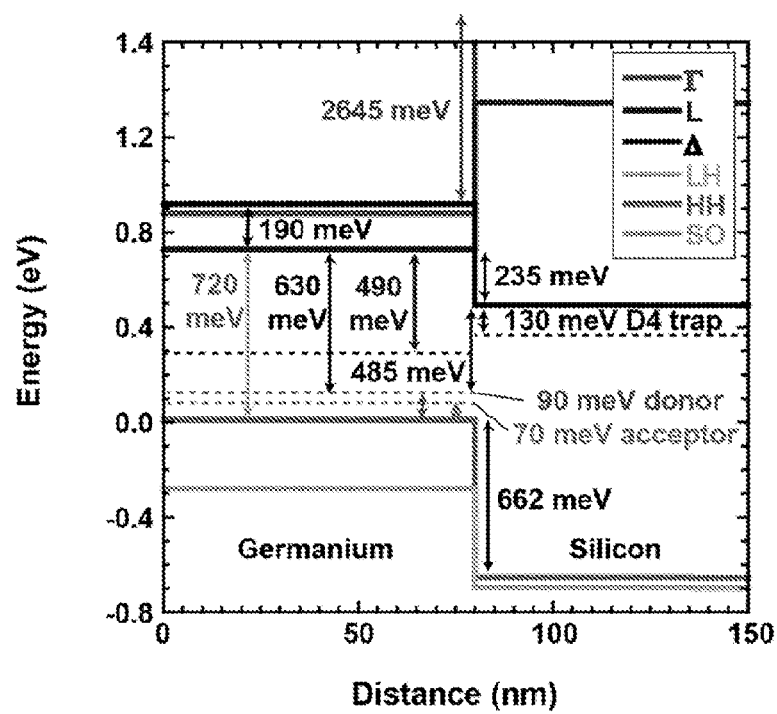
FIG. 18 shows the band structure at the Ge—Si heterointerface at 125 K showing the trapped defect states from dislocations (dashed lines.)

FIG. 18 shows the band structure of the Ge—Si heterointerface calculated at 125 K using the deformation potentials from [24] without any applied electric field for clarity and includes the three main trapped states for dislocations in Ge plotted as dashed lines inside the bandgap [48]. Whilst the 80 to 90 meV activation energy extracted from FIG. 17 is close to the 70 meV acceptor and the 90 meV donor trapped states at the valence band edge from the dislocations in the Ge, it is not clear what mechanism could be responsible for afterpulsing with these states. Metal impurities in Ge with energies close to these values are Co (90 meV acceptor), Zn (90 meV acceptor), Hg (87 meV acceptor) and Cr (70 meV acceptor) [49], none of which are expected to be at any trace levels in the present devices. Metal impurities in Si with similar energies are Bi (69 meV donor), Ga (72 meV acceptor) and Al (67 meV acceptor) [49]. Whilst Al has been used for the contacts and bondpads, these are at the top of the Ge and on the back of the Si wafer and the avalanche region of the device is buried so there should be no Al at trace levels close to the avalanche region of the device.

Figure 20:
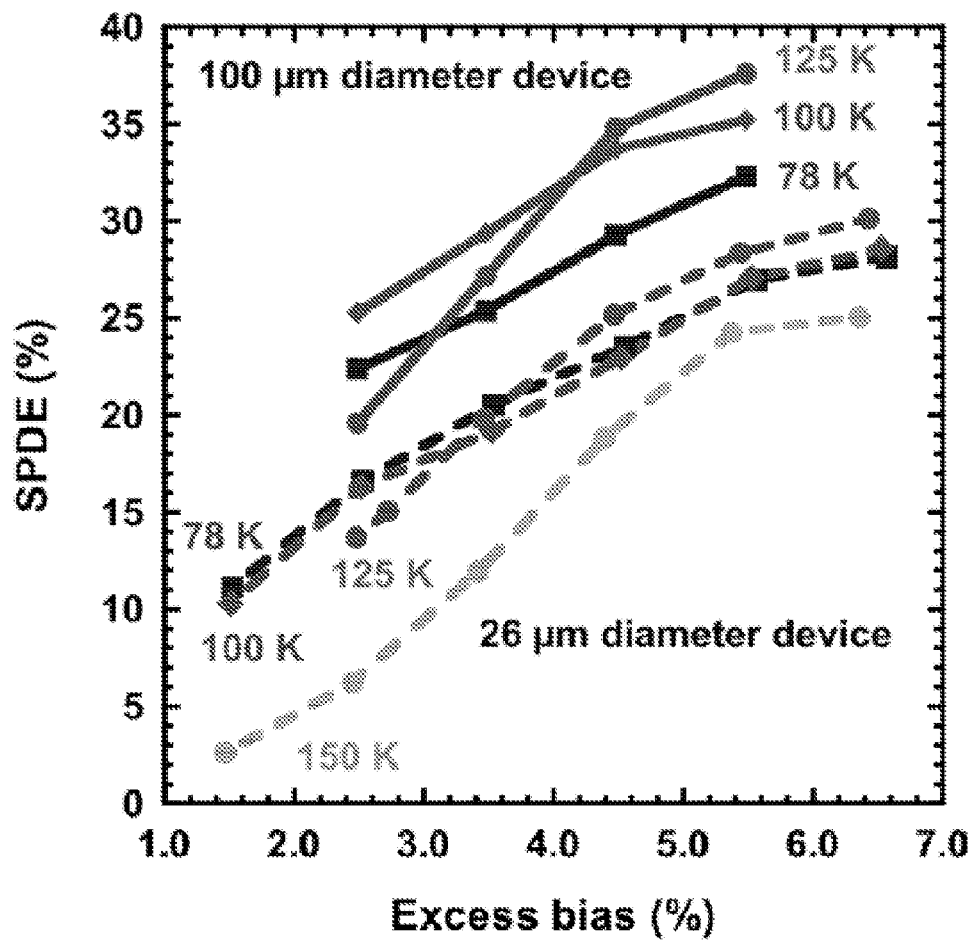
FIG. 20 shows the single photon detection efficiency (SPDE) at 78 K, 100 K, 125 K and 15 OK and 1310 nm wavelength for a 100 µm diameter Ge SPAD of design 1 and a 26 µm diameter Ge SPAD of design 1.
Figure 21:
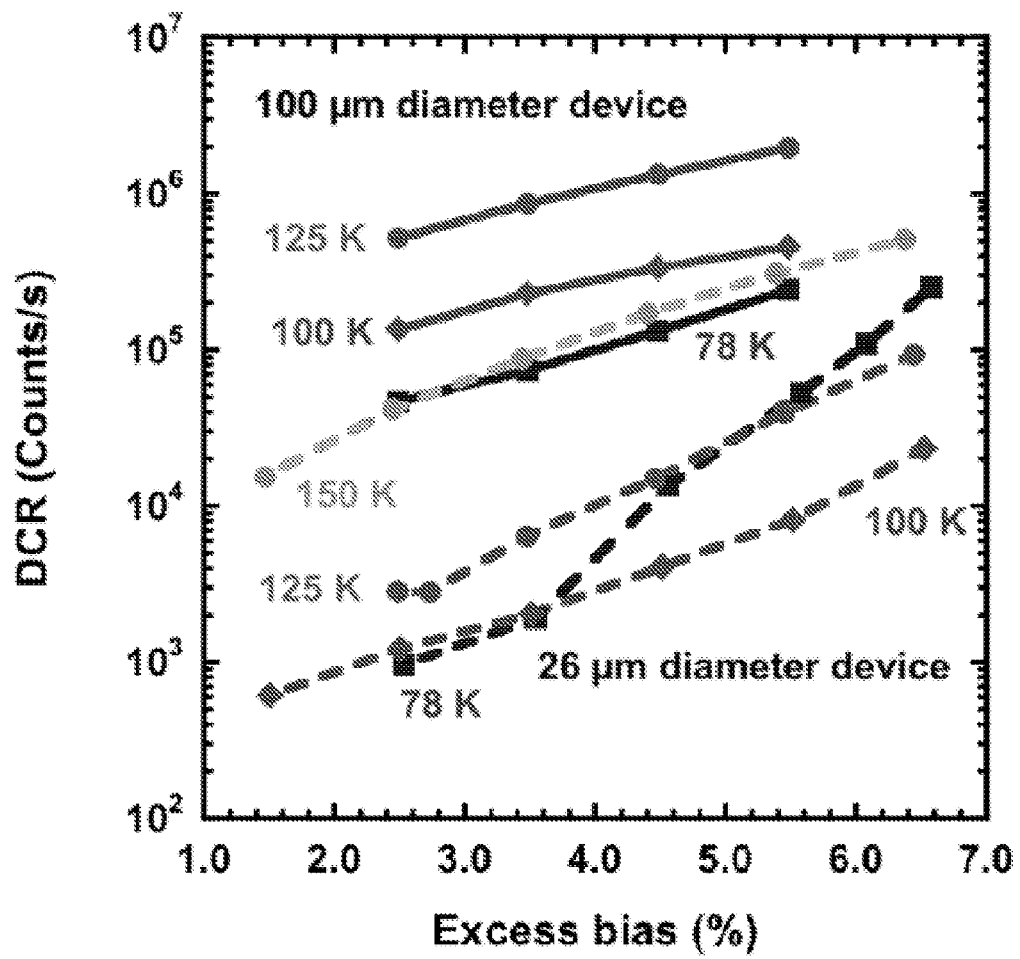
FIG. 21 shows the dark count rate (DCR) at 78 K, 100 K, 125 K and 15 OK and 1310 nm wavelength for a 100 µm diameter Ge SPAD of design 1 and a 26 µm diameter Ge SPAD of design 1.
Figure 22:
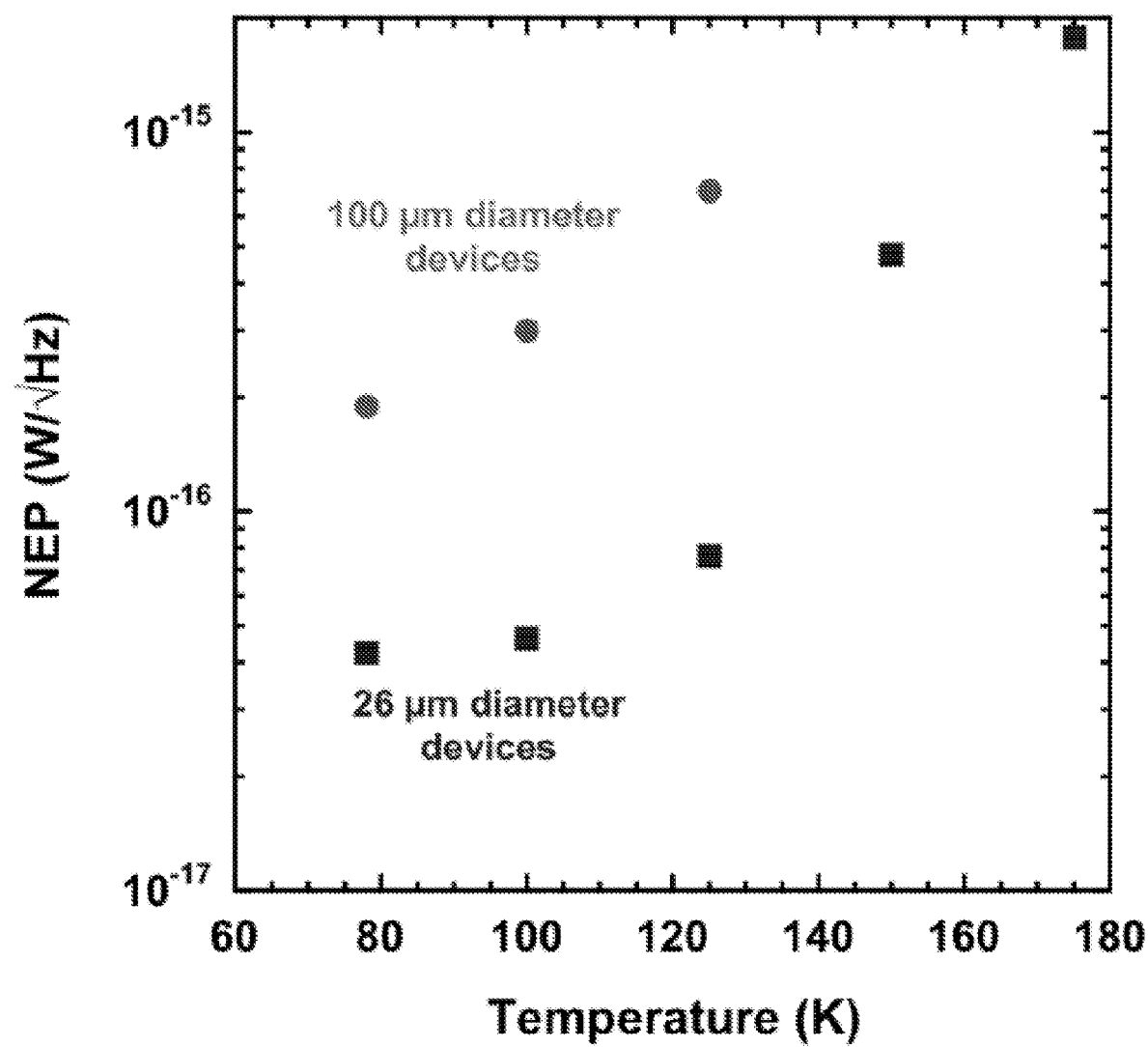
FIG. 22 shows the noise equivalent power (NEP) for a 100 µm diameter Ge SPAD of design 1 and a 26 µm diameter Ge SPAD of design 1.

FIGS. 20, 21 and 22 demonstrates a Ge-on-Si SPAD of 26 µm diameter device having significantly reduced SPDE, DCR and NEP when compared to a Ge-on-Si SPAD of 100 µm diameter at temperatures of 78 K, 100 K, 125 K and 150 K. A small reduction in SPDE was evident in the 26 µm diameter device, however that is likely due to the non-uniform lateral efficiency profile of the device used. It has been further demonstrated that a Ge-on-Si SPAD of 26 µm diameter has a significantly reduced jitter when compared to a Ge-on-Si SPAD of 100 µm diameter (149±10 ps cf. 310±10 ps).

Dislocation traps in Si have been measured to be centred at 807, 870, 940 and 1001 meV above the valence band at 12 K for the D1 to D4 trap states respectively [50]. The last of these dislocation trap states corresponds to about 130 meV below the Si conduction band at 125 K [50] (see FIG. 18) and the linewidth has at least 10 meV of thermal broadening at this temperature. It is well known that during relaxation of a Ge or $Si_{1-x}Ge_x$ heterolayer grown above the critical thickness on a Si substrate that some threading dislocations can be injected into the Si substrate [51] and some level of strain will be transferred into the Si close to the heterointerface which will reduce the energy between the trap state and the conduction band edge. The Si D4 trap state has been identified as being from relaxed dislocations [52] and with the uncertainty of thermal broadening and strain combined with the uncertainty of the afterpulsing excitation energy being extracted from three temperatures, this D4 dislocation trap in Si is a good candidate for the origin of the afterpulsing. Limited area growth of Ge on Si has already demonstrated significant reductions in threading dislocations densities both into the Ge heterolayer and into the Si substrate [53]. It can therefore be determined whether the afterpulsing can be further reduced thereby confirming if the D4 trap state is responsible for the afterpulsing mechanism, and thus to reduce the afterpulsing probability further.

CONCLUSION

We have reported on high performance Ge-on-Si SPADs, designed using a novel planar geometry. SPADs of 100 µm diameter have demonstrated a SPDE of 38% at 125 K and a detection wavelength of 1310 nm, a significant step change improvement in the performance levels from all previous reports of Ge-on-Si SPADs, and now comparing more favourably with commercial InGaAs/InP SPADs. The NEP of $1.9 \times 10^{-16}$ $WHz^{-1/2}$ at a temperature of 78 K is a fifty-fold improvement on previously reported Ge-on-Si SPADs. Afterpulsing performance has been analysed using the time-correlated carrier counting method and compared to a commercial InGaAs SPAD. This initial Ge-on-Si SPAD detector can operate with between a 50% and 75% reduction in dead-time than commercial InGaAs/InP SPADs under the same conditions, leading to operation with a much higher maximum count rate. These results point to a clear route to smaller volume detectors incorporating thicker Ge absorbers being capable of operation at, or near, room temperature, at low dark count rates and high count rate operation. The increased temperature allows these detectors to operate with high-efficiency in the relatively eye-safe 1550 nm wavelength region. The use of a Si platform provides a low-cost route for single-photon 3D imaging and sensing in the eye-safe short-wave infrared region. This could have significance for a range of commonplace applications such as automotive and autonomous vehicle LIDAR, security and environmental LIDAR monitoring in addition to be enabling fora range of quantum technology applications that use the important telecommunications wavelengths.

Methods

Device fabrication. The devices were fabricated from 150 mm diameter $n^{++}$ Si (001) wafers onto which was grown 1.5 µm of undoped Si. Finite element analysis modelling using Silvaco ATLAS software was used to determine the optimum charge sheet density to provide low electric fields in the Ge absorber and high electric fields in the Si avalanche region. Photolithography was then used with ion implantation of boron at 10 kV to selectively produce charge sheet layers. Five different wafers with sheet densities between 1 and $5 \times 10^{11}$ $cm^{-2}$ were produced after activation anneals at 950° C. 1 µm thick undoped Ge was then grown with a top 50 nm doped in-situ with boron for the top Ohmic contact. Photolithography was used with fluorine dry etching to etch electrical isolation trenches into the Ge before $SiO_2$ passivation and planarisation layers were deposited. Al was deposited on the backside of the wafer to form the bottom Ohmic contact. The set of devices whose characterisation results are presented here used a backside contact. As is well understood, and as shown in the drawings, it is possible to form the bottom Ohmic contact using via holes 9 as shown in FIG. 1. The manner of contacting the lower n contact is not considered to be critical to device performance. The top contact approach is considered to be suitable for industrial implementation, whereas the backside contact was more suitable to laboratory scale manufacture and test and reported here. Note that the top contact approach also allows illumination through the substrate which is advantageous for some applications.

Photolithography was then used to etch holes in the oxide to the top Ohmic contact before Ni/Al was deposited and annealed to form the top metal contacts. The $SiO_2$ was etched away on the top of the device and a $Si_3N_4$ antireflection coating was deposited by PECVD.

Figure 19:
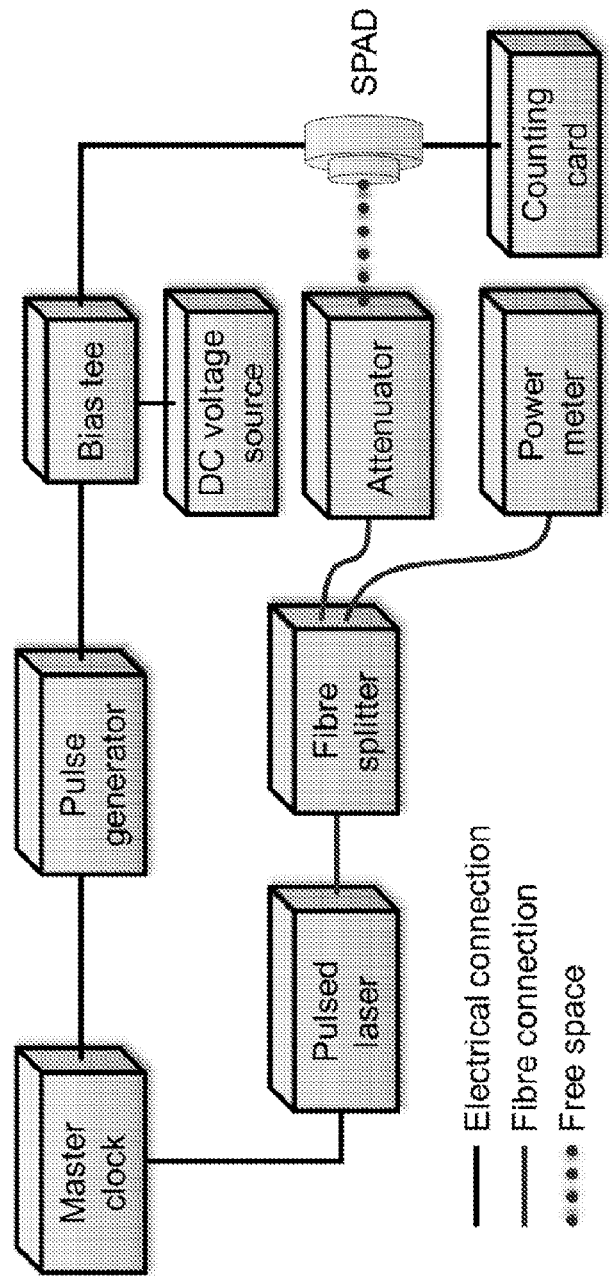
FIG. 19 shows a single-photon characterisation setup—the black lines denote electrical connections, the red solid lines denote fibre optical connections and the red dotted lines denote free space optical connection. The laser spot was directed onto the optical area of the SPAD using a broadband imaging system (not shown).

Single-photon characterisation. SPDE, DCR and jitter measurements were taken using the time-correlated single-photon counting (TCSPC) technique, with a schematic of the setup used for this characterisation shown in FIG. 19. The SPAD detector was mounted in an Oxford Instruments liquid nitrogen cryostat which enabled measurements between 78 K and 175 K. The cryostat has optical access, which allowed a short working distance between the detector and the external optical system. Picosecond pulsed lasers were used to measure the SPDE of the SPAD, with the output attenuated to a level of much less than one photon per pulse in order to reduce the probability of a single pulse containing more than one photon. Two lasers were used—a PicoQuant laser diode emitting a wavelength of 1310 nm as well as an NKT Supercontinuum laser tunable in the wavelength range between 1150 nm and 2000 nm. The laser outputs were coupled into single mode fibres (SMF-28) and then to a 50:50 fibre splitter. One splitter output was connected to a calibrated power meter to provide in-situ power readings, which were continuously monitored during the measurements. The other output was connected to a programmable optical attenuator where it could be attenuated by up to 100 dB. This attenuator output was inserted into a reflective collimator for free space collimation. The collimated beam passed through two pellicle beamsplitter (92:8 splitting ratio), which allowed a broadband illumination channel and an imaging channel to an SWIR camera used to align and focus the laser spot on the SPAD. Prior to each SPDE measurement, the laser power reaching the SPAD was measured and compared to the power measured by the in-situ power meter. This ratio was used to calculate the number of photons per pulse incident upon the SPAD for a given power meter reading. The devices were operated in gated mode with a DC source biasing the SPAD just below the breakdown voltage. A master clock controlled the timing of the laser trigger, the detector gate and the start signal for the Edinburgh Instruments TCC900 photon counting card. A detector gate of 50 ns duration was used in the experiments described in this disclosure. The detector gate was combined with the DC bias using a Tektronix 5530 Bias Tee, with the output connected to the anode of the SPAD. The SPAD cathode was connected to the photon counting card stop signal. Timing histograms with a timing bin width of 19.5 ps recorded by the photon counting card were used to calculate the SPDE, DCR and device jitter.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

For the avoidance of any doubt, any theoretical explanations provided herein are provided for the purposes of improving the understanding of a reader. The inventors do not wish to be bound by any of these theoretical explanations.

Any section headings used herein are for organizational purposes only and are not to be construed as limiting the subject matter described.

Throughout this specification, including the claims which follow, unless the context requires otherwise, the word "comprise" and "include", and variations such as "comprises", "comprising", and "including" will be understood to imply the inclusion of a stated integer or step or group of integers or steps but not the exclusion of any other integer or step or group of integers or steps.

It must be noted that, as used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by the use of the antecedent "about," it will be understood that the particular value forms another embodiment. The term "about" in relation to a numerical value is optional and means for example +/−10%.

REFERENCES

A number of publications are cited above in order to more fully describe and disclose the invention and the state of the art to which the invention pertains. Full citations for these references are provided below. The entirety of each of these references is incorporated herein.

[1] Buller, G. S. & Collins, R. J. Single-photon generation and detection. *Meas. Sci. Technol.* 21, 012002 (2010).

[2] Hadfield, R. H. Single-photon detectors for optical quantum information applications. *Nature Photon.* 3, 696-705 (2009).

[3] Cova, S., Ghioni, M., Lotito, A., Rech, I. & Zappa, F. Evolution and prospects for single-photon avalanche diodes and quenching circuits. *J. Mod Optics* 51, 1267-1288 (2004).

[4] Shadbolt, P., Matthews, J. C. F., Laing, A. & J. L. O'Brien Testing foundations of quantum mechanics with photons. *Nature Phys.* 10, 278-286 (2014).

[5] Gordon, K. J., Fernandez, V., Townsend, P. D. & Buller, G. S. A short wavelength gigahertz clocked fiber-optic quantum key distribution system. *IEEE J. Quant. Electron.* 40, 900-908 (2004).

[6] Pugh, C. J. et al. Airborne demonstration of a quantum key distribution receiver payload. *Quantum Science and Technology* 2, 024009 (2017).

[7] Buller, G. S. & Wallace, A. M., Recent advances in ranging and three-dimensional imaging using time-correlated single-photon counting. *IEEE J. Sel. Top. Quantum Electron.* 13, 1006-1015 (2007).

[8] Charbon, E. & Donati, S., SPAD sensors come of age. *Optics and Photonics News* 36, (2010).

[9] Niclass, C., Inoue, D., Matsubara, H., Ichikawa, T. & Soga, M. Development of automotive LIDAR. *Elec. Comm. Japan* 98, 1476-1480 (2015).

[10] Gyongy, I., Dutton, N. A. W. & Henderson R. K., Single-photon tracking for high-speed vision. *Sensors* 18, 323 (2018).

[11] Takai, I. et al. Single-photon avalanche diode with enhanced NIR-sensitivity for automotive LIDAR systems. *Sensors* 16, 459 (2016).

[12] Pellegrini et al. Industrialised SPAD in 40 nm technology, 2017 *IEEE Int. Electron Dev. Meeting* 8268404 (2017).
[13] IEC-60825-1 standard
[14] Bird, R. E., Hulstrom, R. L. & Lewis, L. J. Terrestrial solar spectral data sets. *Solar Energy* 30, 563-573 (1983).
[15] Christnacher, F. et al. Influence of gating and of the gate shape on the penetration capacity of range-gated active imaging in scattering environments. *Opt. Express* 23, 32897-32908 (2015).
[16] Arnulf, A., Bricard, J., Curé, E. & Véret, C. Transmission by haze and fog in the spectral region 0.35 to 10 microns. *J. Opt. Soc. Am.* 47, 491-498 (1957).
[A] Dumont, M., Brissaud, O., Picard, G., Schmitt, B., Gallet, J.-C. &. Arnaud, Y., High-accuracy measurements of snow bidirectional reflectance distribution function at visible and NIR wavelengths—comparison with modelling results. *Atmos. Chem. Phys.* 10, 2507-2520 (2010).
[17] Korzh, B. et al. Provably secure and practical quantum key distribution over 307 km of optical fibre. *Nature Photon.* 9, 163-168 (2015).
[18] McCarthy, A. et al. Kilometer-range depth imaging at 1550 nm wavelength using an InGaAs/InP single-photon avalanche diode detector. *Opt. Express* 21, 19, pp. 22098-22113 (2013)
[19] Pawlikowska, A. M., Halimi, A., Lamb, R. A. & Buller, G. S. Single-photon three-dimensional imaging at up to 10 kilometers range. *Opt. Express* 25, 11919-11931 (2017).
[20] Jiang, X. et al. InP-based single photon detectors and geiger-mode APD arrays for quantum communication applications. *IEEE J. Sel. Top. Quantum Electron.* 21, 3800112 (2015).
[21] Sammak, A., Aminian, M., Nanver, L. K. & Charbon, E. CMOS-Compatible PureGaB Ge-on-Si APD pixel arrays. *IEEE Trans. Electron Dev.* 63, 92-99 (2016).
[22] Buller, G. S. et al. Time-resolved photoluminescence measurements of InGaAs/InP multiple-quantum-well structures at 1.3 μm wavelengths by use of germanium single-photon avalanche photodiodes. *Appl. Opt.* 35, 916-921 (1996).
[23] Loudon, A. Y. et al. Enhancement of the infrared detection efficiency of silicon photon-counting avalanche photodiodes by use of silicon germanium absorbing layers. *Opt. Lett.* 27, 219-221 (2002).
[24] Paul, D. J. 8-band k.p modelling of mid-infrared intersubband absorption in Ge quantum wells. *J. Appl. Phys.* 120, 043103 (2016).
[25] Kang, Y. et al. Monolithic germanium/silicon avalanche photodiodes with 340 GHz gain-bandwidth product. *Nature Photon.* 3, 59-63 (2009).
[26] Derose, C. T. et al. Ultra compact 45 GHz CMOS compatible germanium waveguide photodiode with low dark current. *Opt. Express* 19, 527-534 (2011).
[27] Martinez, N. J. D. et al. High performance waveguide-coupled Ge-on-Si linear mode avalanche photodiodes. *Opt. Express* 24, 19072-19081 (2016).
[28] Lu, Z. et al. Geiger-mode operation of Ge-on-Si avalanche photodiodes. *IEEE J. Quantum Electron.* 47, 731-735 (2011).
[29] Warburton, R. E. et al. Ge-on-Si single-photon avalanche diode detectors: design, modeling, fabrication, and characterization at wavelengths 1310 and 1550 nm. *IEEE Trans. Electron Dev.* 60, 3807-3813 (2013).
[30] Martinez, N. J. D. et al. Single photon detection in a waveguide-coupled Ge-on-Si lateral avalanche photodiode. *Opt. Express* 25, 16130-16139 (2017).
[31] Webster, E. A. G. & Henderson, R. K. A TCAD and spectroscopy study of dark count mechanisms in single-photon avalanche diodes. *IEEE Trans. Electron Dev.* 60, 4014-4019 (2013).
[32] Sciacca, E. et al. Silicon planar technology for single-photon optical detectors. *IEEE Trans. Elec. Dev.* 50, 918-925 (2003).
[33] Zhang, J., Itzler, M. A., Zbinden, H. & Pan, J.-W. Advances in InGaAs/InP single-photon detector systems for quantum communication. *Light: Science & Applications* 4, e286 (2015).
[34] Tosi, A., Calandri, N., Sanzaro, M. & Acerbi, F. Low-noise, low-jitter, high detection efficiency InGaAs/InP single-photon avalanche diode. *IEEE J. Sel. Top. Quantum Electron.* 20, 3803406 (2014).
[35] Amri, E., Boso, G., Korzh, B. & Zbinden, H. Temporal jitter in free-running InGaAs/InP single-photon avalanche detectors. *Optics Letters* 41, 5728-5731 (2016).
[36] Paul, D. J. 8-band k.p modelling of the quantum confined Stark effect in Ge quantum wells on Si substrates. *Phys. Rev. B* 77, 155323 (2008).
[37] Dash, W. C. & Newman, R. Intrinsic optical absorption in single-crystal germanium and silicon at 77K and 300K. *Phys. Rev.* 99, 1151-1155 (1955).
[38] Itzler, M. A. et al. Single photon avalanche diodes (SPADs) for 1.5 μm photon counting applications. *J. Modern Optics* 54, 283-304 (2007).
[39] Wang, S., Ma, F., Li, X., Karve, G., Zheng, X. & Campbell, J. C. Analysis of breakdown probabilities in avalanche photodiodes using a history-dependent analytical model. *Appl. Phys. Lett.* 82, 1971-1973 (2003).
[40] Lacaita, A. & Mastrapasqua, M. Strong dependence of time resolution on detector diameter in single photon avalanche diodes. *Electron. Lett.* 26, 2053-2054 (1990).
[41] Varshni, Y. P. Temperature dependence of the energy gap in semiconductors. *Physica* 34, 149-154 (1967).
[42] Buller, G. S et al. Semiconductor avalanche diode detectors for quantum cryptography. *IEEE LEOS Newsletter* 20, (2006).
[43] Jiang, X., Itzler, M. A., Ben-Michael, R. & Slomkowski, K. InGaAsP—InP avalanche photodiodes for single photon detection. *IEEE J. Sel. Top. Quantum Electron.* 13, 895-905 (2007).
[44] Korzh, B., Lunghi, T., Kuzmenko, K., Boso, G. & Zbinden, H. Afterpulsing studies of low-noise InGaAs/InP single-photon negative-feedback avalanche diodes. *J. Modern Optics* 62, 1151-1157 (2015).
[45] Tosi, A., Mora, A. D., Zappa, F. & Cova, S. Single-photon avalanche diodes for the near-infrared range: detector and circuit issues. *J. Modern Optics* 56, 299-308 (2009).
[46] Statz, H., deMars, G., Davis Jr., L. & Adams Jr., A. Surface states on silicon and germanium surfaces. *Phys. Rev.* 106, 455-464 (1957).
[47] Zhang, R., Iwasaki, T., Taoka, N., Takenaka, M. & Takagi, S. Al$_2$O$_3$/GeO$_x$/Ge gate stacks with low trap density fabricated by electron cyclotron resonance plasma postoxidation. *Appl. Phys. Lett.* 98, 112902 (2011).
[48] Shevchenko, S. V. Electrical conductivity of germanium with dislocation grids. *J. Exp. Theor. Phys.* 88, 66-71 (1999).
[49] Sze, S. Physics of Semiconductor Devices. $2^{nd}$ Ed. Wiley, New York (1981).
[50] Binetti, S., Pizzini, S., Leoni, E., Somaschini, R., Castaldini, A., & Cavallini, A. Optical properties of oxygen precipitates and dislocations in silicon. *J. Appl. Phys.* 92, 2437-2445 (2002).

[51] LeGoues, F. K., Meyerson, B. S., Morar, J. F. & Kirchner, P. D. Mechanism and conditions for anomalous strain relaxation in graded thin films and superlattices. *J. Appl. Phys.* 71, 4230-3243 (1992).

[52] Sauer, R., Weber, J., Soltz, J. Weber, E. R., Küsters, K.-H. and Alexander, H. Dislocation-related photoluminescence in silicon. *Appl. Phys. A* 36, 1-13 (1985).

[53] Noble, D. B., Hoyt, J. L., King, C. A. & Gibbons, J. F., Reduction in misfit dislocation density by the selective growth of $Si_{1-x}Ge_x/Si$ in small areas. *Appl. Phys. Lett.* 56, 51-53 (1990).

[54] R. Tobin, A. Halimi, A. McCarthy, M. Laurenzis, F. Christnacher and G. S. Buller, "Depth imaging through obscurants using time-correlated single-photon counting" Proc. SPIE, 10659, 106590S (2018).

The invention claimed is:

1. A single photon avalanche diode (SPAD) device comprising:
    a Si-based avalanche layer formed over an n-type semiconductor contact layer;
    a p-type charge sheet layer formed in or on the avalanche layer, the p-type charge sheet layer having an in-plane width;
    a Ge-based absorber layer, formed over the charge sheet layer and/or the avalanche layer, and overlapping the charge sheet layer, the Ge-based absorber layer having an in-plane width;
    wherein, at least in one in-plane direction, the in-plane width of the Ge-based absorber layer is greater than the in-plane width of the p-type charge sheet layer.

2. A SPAD device according to claim 1 wherein in all in-plane directions, the in-plane width of the Ge-based absorber layer is greater than the in-plane width of the p-type charge sheet layer.

3. A SPAD device according to claim 1, further comprising:
    a p-type semiconductor contact layer formed over the absorber layer, the p-type semiconductor contact layer having an in-plane width,
    wherein at least part of the p-type semiconductor contact layer is formed substantially in register with at least part of the p-type charge sheet layer, with the Ge-based absorber layer interposed between them.

4. A SPAD device according to claim 3 wherein, at least in one in-plane direction, the in-plane width of the Ge-based absorber layer is greater than the in-plane width of the p-type semiconductor contact layer.

5. A SPAD device according to claim 3 wherein, in all in-plane directions, the in-plane width of the Ge-based absorber layer is greater than the in-plane width of the p-type semiconductor contact layer.

6. A SPAD device according to claim 3 wherein, in all in-plane directions, the in-plane width of the Ge-based absorber layer is greater than the in-plane width of the p-type semiconductor contact layer and greater than the in-plane width of the p-type charge sheet layer.

7. A SPAD device according to claim 3 wherein the entire p-type semiconductor contact layer is formed substantially in register with at least part of the p-type charge sheet layer.

8. A SPAD device according to claim 3
    wherein at least in one in-plane direction, the in-plane width of the p-type charge sheet layer is greater than the in-plane width of the p-type semiconductor contact layer, and
    wherein the Ge-based absorber layer has a sidewall in said in-plane direction and the charge sheet layer has a lateral edge in said in-plane direction, and either:
        (a) when the Ge-based absorber layer has a thickness of at least 1 µm, the distance in the in-plane direction between the lateral edge of the charge sheet layer and the sidewall of the Ge-based absorber layer is at least 1 µm greater than the thickness of the Ge-based absorber layer; or
        (b) when the Ge-based absorber layer has a thickness of less than 1 µm, the distance in the in-plane direction between the lateral edge of the charge sheet layer and the sidewall of the Ge-based absorber layer is at least 1.0 µm.

9. A SPAD device according to claim 8 wherein the distance in the in-plane direction between the lateral edge of the charge sheet layer and the sidewall of the Ge-based absorber layer is at least 5 µm.

10. A SPAD device according to claim 3, wherein the p-type semiconductor contact layer has a lateral edge in said in-plane direction and the charge sheet layer has a lateral edge in said in-plane direction, and either:
    (c) when the width of the charge sheet is at least 25 µm, a distance in the in-plane direction between the lateral edge of the charge sheet layer and the lateral edge of the p-type semiconductor contact layer is at least 2 µm; or
    (d) when the width of the charge sheet is less than 25 µm, a distance in the in-plane direction between the lateral edge of the charge sheet layer and the lateral edge of the p-type semiconductor contact layer is at least 1 µm.

11. A SPAD device according to claim 1 wherein the charge sheet layer has a maximum doping concentration at a depth in the range 10-100 nm from the surface of the Si-based avalanche layer.

12. A SPAD array comprising at least a 1×2 arrangement of SPAD devices each according to claim 1 and formed on a common substrate.

13. A SPAD array according to claim 12 wherein the respective Ge-based absorber layers of adjacent SPAD devices are laterally isolated by:
    (i) etching of a continuous Ge-based absorber layer to at least the depth of the p-type charge sheet layer in order to form the respective Ge-based absorber layers of adjacent SPAD devices; or
    (ii) doping of a continuous Ge-based absorber layer to at least the depth of the p-type charge sheet layer in order to form the respective Ge-based absorber layers of adjacent SPAD devices; or
    (iii) selective area growth of the respective Ge-based absorber layers within patterned electrically insulating layers in order to form the respective Ge absorber layers of adjacent SPAD devices.

14. A LIDAR system comprising a source of light of wavelength in the range 0.9-2.0 µm and a SPAD device according to claim 1.

15. Use of a SPAD device according to claim 1 in the detection of at least one photon with wavelength in the range 0.9-2.0 µm.

16. A method of manufacture of a SPAD device according to claim 1 wherein the p-type charge sheet layer is formed by selective area implantation into the Si-based avalanche layer.

17. A method according to claim 16 wherein the charge sheet layer is activated by annealing at a temperature of at least 850° C., before deposition of the Ge-based absorber layer.

18. A method according to claim 16 wherein at least one upper and/or side surface of the Ge-based absorber layer is passivated.

19. A method according to claim 18 wherein the passivation is provided by a $GeO_2$ layer thermally grown and protected by an $Al_2O_3$ layer.

20. A single photon avalanche diode (SPAD) device comprising:
- a Si-based avalanche layer on an n-type semiconductor contact layer;
- a p-type charge sheet layer in or on the avalanche layer, the p-type charge sheet layer having an in-plane width;
- a Ge-based absorber layer, over the charge sheet layer and/or the avalanche layer, and overlapping the charge sheet layer, the Ge-based absorber layer having an in-plane width; and
- a p-type semiconductor contact layer over the Ge-based absorber layer, the p-type semiconductor contact layer having an in-plane width,
- wherein, at least in one in-plane direction, the in-plane width of the Ge-based absorber layer is greater than the in-plane width of the p-type charge sheet layer, and
- wherein, in all in-plane directions, the in-plane width of the Ge-based absorber layer is greater than the in-plane width of the p-type semiconductor contact layer.

* * * * *

UNITED STATES PATENT AND TRADEMARK OFFICE
CERTIFICATE OF CORRECTION

PATENT NO. : 12,140,707 B2
APPLICATION NO. : 17/274914
DATED : November 12, 2024
INVENTOR(S) : Paul et al.

It is certified that error appears in the above-identified patent and that said Letters Patent is hereby corrected as shown below:

In the Specification

Column 1, Line 55: Please correct "low 10%)" to read --low ($\leq 10\%$)--

Column 1, Line 61: Please correct "cost £100 k" to read --cost $\geq$£100 k--

Column 4, Line 56: Please insert a paragraph break between "78 K." and "Preferably,"

Column 6, Line 37: Please correct "S102" to read --$SiO_2$--

Column 6, Line 49: Please correct "A=1310 nm" to read --$\lambda$=1310 nm--

Column 6, Line 64: Please correct "A=1310 nm" to read --$\lambda$=1310 nm--

Column 7, Line 15: Please correct "15 OK" to read --150 K--

Column 7, Line 19: Please correct "15 OK" to read --150 K--

Column 10, Line 34: Please correct "p++" to read --$p^{++}$--

Column 11, Line 62: Please correct "p+Si" to read --$p^+$ Si--

Column 13, Line 16: Please correct "p++Ge" to read --$p^{++}$ Ge--

Column 14, Line 12: Please correct "2=1310 nm" to read --$\lambda$=1310 nm--

Column 14, Line 30: Please correct "fora" to read --for a--

Column 14, Line 62: Please correct "A-valley" to read --$\Delta$-valley--

Signed and Sealed this
Twenty-seventh Day of May, 2025

Coke Morgan Stewart
*Acting Director of the United States Patent and Trademark Office*

CERTIFICATE OF CORRECTION (continued)
U.S. Pat. No. 12,140,707 B2

Column 15, Line 43: Please correct "A=1310 nm" to read --$\lambda$=1310 nm--

Column 15, Line 57: Please correct "F-point" to read --$\Gamma$-point--

Column 16, Line 13: Please correct "A$_0$" to read --$\lambda_c$--

Column 16, Line 24: Please correct "10 ps" to read --10 μs--

Column 16, Line 57: Please correct "10 ps" to read --10 μs--

Column 19, Line 2: Please correct "Ni/AI" to read --Ni/Al--